United States Patent
Kuga

(10) Patent No.: US 11,482,805 B2
(45) Date of Patent: Oct. 25, 2022

(54) ELECTRICAL CONTACTOR, ELECTRICAL CONNECTING STRUCTURE AND ELECTRICAL CONNECTING APPARATUS

(71) Applicant: KABUSHIKI KAISHA NIHON MICRONICS, Tokyo (JP)

(72) Inventor: Tomoaki Kuga, Tokyo (JP)

(73) Assignee: KABUSHIKI KAISHA NIHON MICRONICS, Tokyo (JP)

(*) Notice: Subject to any disclaimer, the term of this patent is extended or adjusted under 35 U.S.C. 154(b) by 97 days.

(21) Appl. No.: 17/028,479

(22) Filed: Sep. 22, 2020

(65) Prior Publication Data
US 2021/0098920 A1    Apr. 1, 2021

(30) Foreign Application Priority Data
Oct. 1, 2019    (JP) .............................. JP2019-181411

(51) Int. Cl.
*H01R 13/24*    (2006.01)
*G01R 1/067*    (2006.01)

(52) U.S. Cl.
CPC ..... *H01R 13/2407* (2013.01); *G01R 1/06722* (2013.01)

(58) Field of Classification Search
CPC ............ H01R 13/2407; H01R 13/2435; H01R 13/245; H01R 13/2471; H01R 13/714; G01R 1/06722

(Continued)

(56) References Cited

U.S. PATENT DOCUMENTS 4,961,709 A * 10/1990 Noschese ........... H01R 13/2421
439/82
5,167,512 A * 12/1992 Walkup .............. H01R 13/2421
439/65

(Continued)

FOREIGN PATENT DOCUMENTS

| CN | 102738626 A | 10/2012 |
| CN | 108283014 A | 7/2018 |

(Continued)

OTHER PUBLICATIONS

First Office Action and Search Result dated Dec. 16, 2021 in the corresponding Chinese Patent Appln. No. 202011049439.5.

(Continued)

*Primary Examiner* — Marcus E Harcum
(74) *Attorney, Agent, or Firm* — Bacon & Thomas, PLLC

(57) ABSTRACT

Provided is an electrical contactor that is formed from a small number of components that can improve the conductivity in the electrical contactor, while improving the slidability of an elastic member and the electrical contact stability with a contact target. The present disclosure provides an electrical contactor which is formed from a plate-shaped member, the plate-shaped member including: a main body; an upper arm portion; a first tip end portion provided at a tip end of the upper arm portion; a lower arm portion; and a second tip end portion provided at a tip end of the lower arm portion, the electrical contactor including: a first contact portion formed by winding the first tip end portion; a first elastic portion formed by winding the upper arm portion and having a bamboo-shoot-like spring structure; a second contact portion formed by winding the second tip end portion; a second elastic portion formed by winding the lower arm portion and having a bamboo-shoot-like spring structure; and a coupling portion that couples the first elastic portion and the second elastic portion to enable elasticity of (Continued)

each of the first elastic portion and the second elastic portion by winding the main body, in which each or either of a tip end surface of the first contact portion that contacts the first contact target and a tip end surface of the second contact portion that contacts the second contact target is an inclined surface.

13 Claims, 15 Drawing Sheets

(58) Field of Classification Search
USPC .............................. 439/82, 169, 66, 74, 700
See application file for complete search history.

(56) References Cited

U.S. PATENT DOCUMENTS

| | | | | |
|---|---|---|---|---|
| 5,667,410 | A * | 9/1997 | Johnston | G01R 1/06722 |
| | | | | 324/755.05 |
| 6,843,658 | B2 * | 1/2005 | Kuwabara | H01R 13/2421 |
| | | | | 439/66 |
| 6,974,332 | B2 * | 12/2005 | Ma | H01R 43/16 |
| | | | | 439/71 |
| 7,014,473 | B2 * | 3/2006 | Millard | H01R 13/2407 |
| | | | | 439/66 |
| 7,219,426 | B2 * | 5/2007 | Haga | G01R 1/0466 |
| | | | | 439/82 |
| 7,629,534 | B2 * | 12/2009 | Ikeda | H01R 12/52 |
| | | | | 174/94 R |
| 9,435,827 | B2 * | 9/2016 | Pak | G01R 3/00 |
| 10,312,613 | B2 * | 6/2019 | Taylor | H05K 7/023 |
| 2012/0042509 | A1 * | 2/2012 | Takeya | G01R 1/07371 |
| | | | | 29/829 |
| 2015/0253356 | A1 | 9/2015 | Kuo et al. | |
| 2016/0146885 | A1 * | 5/2016 | Ando | G01R 1/067 |
| | | | | 324/754.11 |
| 2021/0231706 | A1 | 7/2021 | Pak | |
| 2021/0249174 | A1 | 8/2021 | Brockschmidt, Jr. et al. | |

FOREIGN PATENT DOCUMENTS

| | | | |
|---|---|---|---|
| JP | 2011-12992 A | | 1/2011 |
| KR | 20120032500 A | * | 2/2012 |
| KR | 10-2012-0031493 A | | 4/2012 |
| KR | 20130037699 A | * | 4/2013 |
| KR | 10-1974811 B1 | | 5/2019 |
| TW | M358968 | | 6/2009 |
| TW | 201530149 A | | 8/2015 |

OTHER PUBLICATIONS

First Office Action and Search Result dated Oct. 21, 2021 in the corresponding Taiwan Patent Appln No. 109132666.

Second Office Action dated Aug. 3, 2022 in the corresponding Chinese Patent Appln. No. 202011049439.5.

* cited by examiner

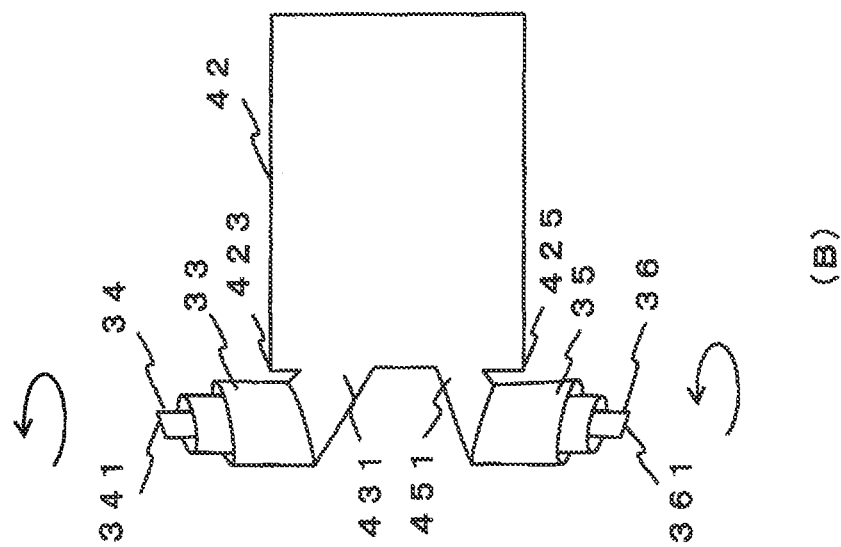
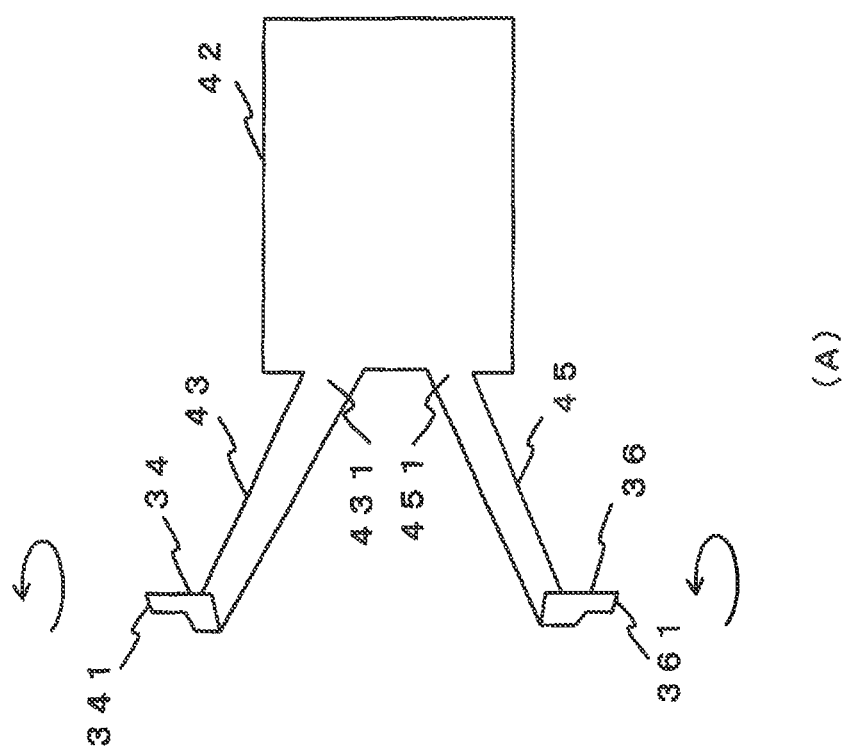
FIG.4

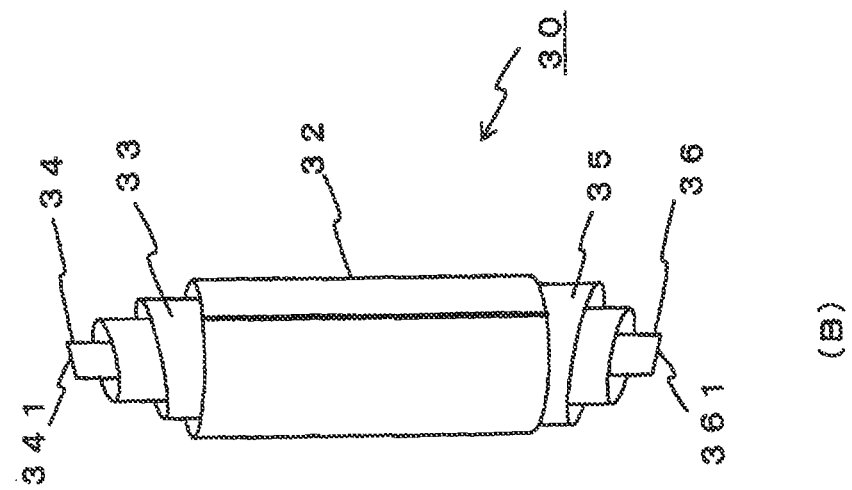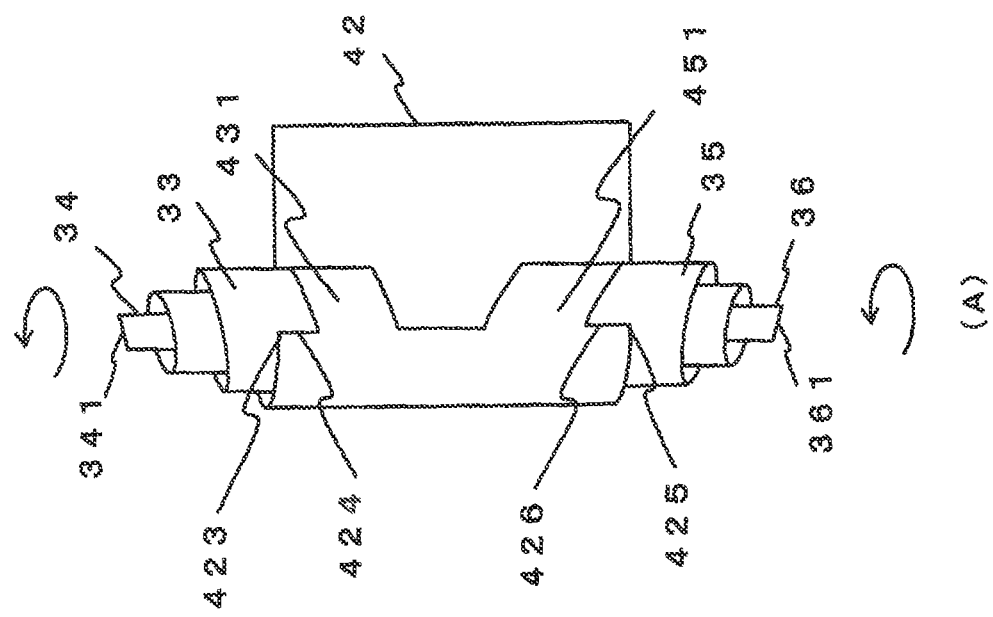
FIG.5

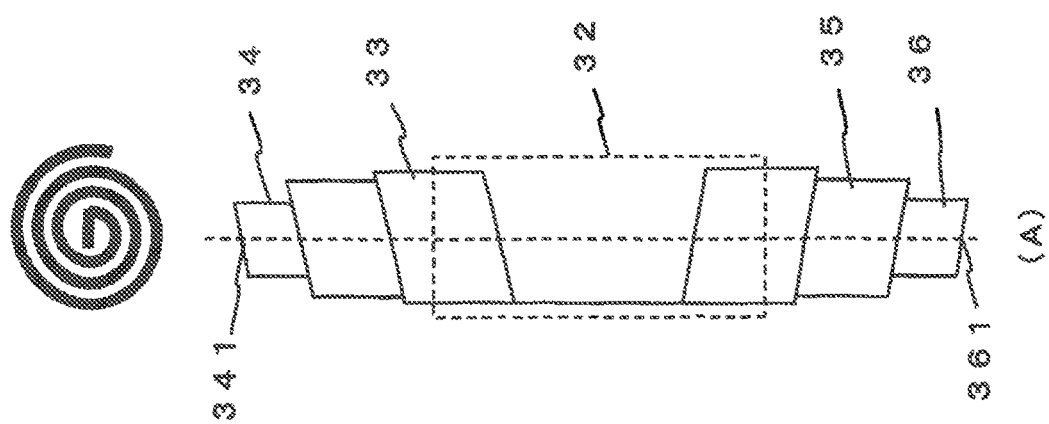
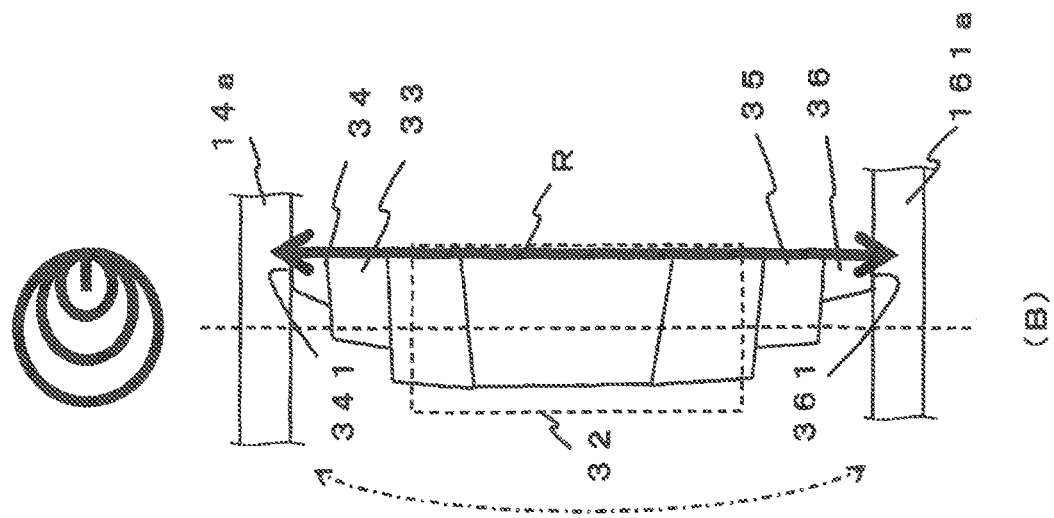
FIG. 8

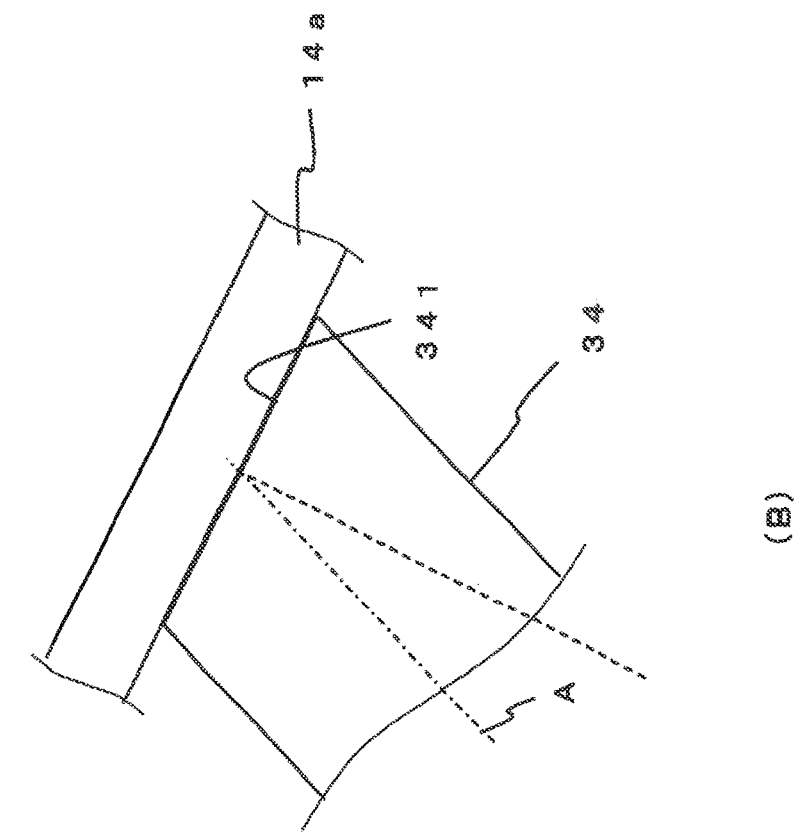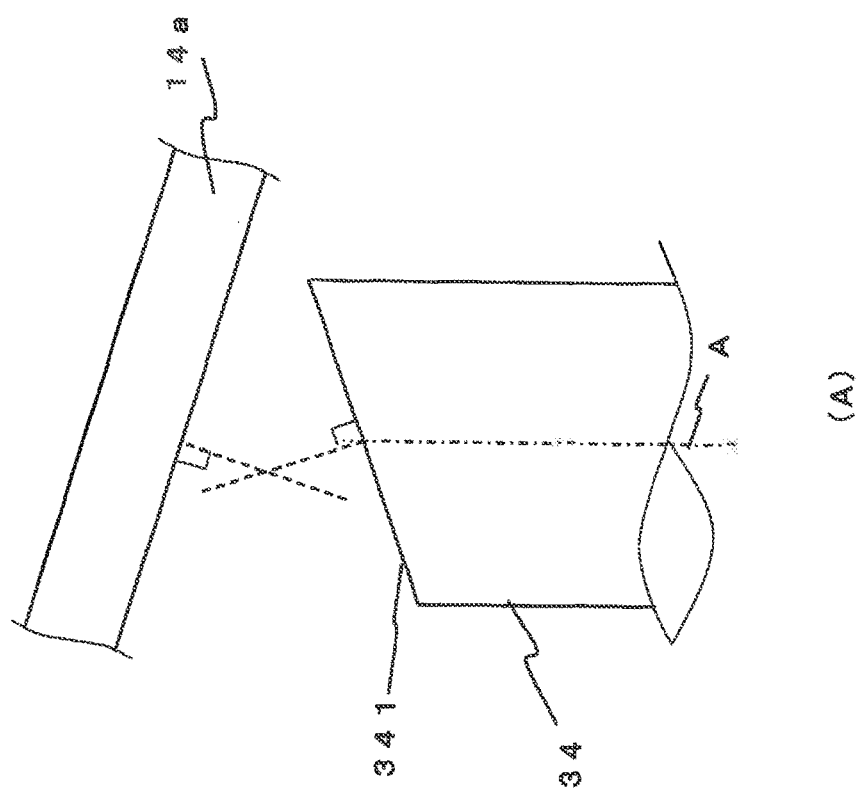
FIG.9

ELECTRICAL CONTACTOR, ELECTRICAL CONNECTING STRUCTURE AND ELECTRICAL CONNECTING APPARATUS

CROSS-REFERENCE TO RELATED APPLICATIONS

The present application claims, under 35 USC 119, priority of Japanese Patent Application No. 2019-181411 filed on Oct. 1, 2019.

TECHNICAL FIELD

The present disclosure relates to an electrical contactor, an electrical connecting structure, and an electrical connecting apparatus, and is applicable to, for example, an electrical contactor, an electrical connecting structure, and an electrical connecting apparatus used for a current test of an integrated circuit on a semiconductor wafer and an object to be inspected.

BACKGROUND ART

Electrical characteristics of an object to be inspected, such as an integrated circuit formed on a semiconductor wafer or a packaged integrated circuit, are inspected at each manufacturing stage. An electrical connecting apparatus such as a probe card is used for the electrical inspection of the integrated circuit on the semiconductor wafer, whereas an electrical connecting apparatus such as a socket is used for the electrical inspection of the packaged integrated circuit. In such an electrical connecting apparatus, an electrical contactor which contacts a first contact target and a second contact target is used, and an electrical signal is conducted between the first contact target and the second contact target through the electrical contactor.

Conventionally, there are various types of electrical contactors, some of which are formed by combining a plurality of components. When an electrical signal is conducted between the first contact target and the second contact target using such an electrical contactor formed from the plurality of components, a resistance becomes high at a contact point between the components, which may affect the electrical conductivity.

Patent Literature 1 discloses a spring probe in which a thin-walled strip substrate is bent to integrally form a spiral tubular sleeve, a first terminal at one end of the tubular sleeve, and a second terminal at the other end of the tubular sleeve. Such a spring probe has good electrical conductivity because all components are integrally formed from the thin-walled strip substrate.

CITATION LIST

Patent Literature

Patent Literature 1: Japanese Unexamined Patent Application Publication No. 2011-12992

SUMMARY OF INVENTION

Technical Problem

However, when the electrical signal is conducted between the first contact target and the second contact target using the spring probe described in Patent Literature 1, an electrical conduction path in the spring probe passes through a pair of spirally wound coil springs, and thus the length of the path becomes long, which requires the improvement in electrical conductivity.

In view of the above problems, the present disclosure is intended to provide an electrical contactor, an electrical connecting structure, and an electrical connecting apparatus that are formed from a small number of components and can improve the conductivity in the electrical contactor, while improving the slidability of an elastic member and the electrical contact stability with a contact target.

Solution to Problem

To solve such problems, an electrical contactor according to a first aspect of the present disclosure is characterized by being formed from a plate-shaped member having electrical conductivity, the plate-shaped member including: a main body; a tapered upper arm portion extending diagonally upward from one end portion of the main body; a first tip end portion provided at a tip end of the upper arm portion; a tapered lower arm portion extending diagonally downward from one end portion of the main body; and a second tip end portion provided at a tip end of the lower arm portion, the electrical contactor including: (1) a first contact portion formed by winding the first tip end portion and configured to contact a first contact target; (2) a first elastic portion formed by winding the upper arm portion, the first elastic portion having a bamboo-shoot-like spring structure that elastically moves the first contact portion in an axial direction; (3) a second contact portion formed by winding the second tip end portion and configured to contact a second contact target; (4) a second elastic portion formed by winding the lower arm portion, the second elastic portion having a bamboo-shoot-like spring structure that elastically moves the second contact portion in the axial direction; and (5) a coupling portion that couples the first elastic portion and the second elastic portion to enable elasticity of each of the first elastic portion and the second elastic portion by winding the main body, in which each or either of a tip end surface of the first contact portion that contacts the first contact target and a tip end surface of the second contact portion that contacts the second contact target is an inclined surface.

An electrical contactor according to a second aspect of the present disclosure is characterized by being formed from a plate-shaped member having electrical conductivity, (1) the plate-shaped member comprising: a main body; a tapered upper arm portion extending diagonally upward from one end portion of the main body; a tip end portion provided at a tip end of the upper arm portion; and a plurality of chevron-shaped protrusions provided at a lower end portion of the main body, the electrical contactor comprising: (2) a first contact portion formed by winding the tip end portion and configured to contact a first contact target; (3) an elastic portion formed by winding the upper arm portion, the elastic portion having a bamboo-shoot-like spring structure that elastically moves the first contact portion in an axial direction; and (4) a cylindrical portion that accommodates a proximal end portion of the elastic portion therein by winding the main body, the cylindrical portion being configured to contact a second contact target, together with the plurality of chevron-shaped protrusions on the lower end portion, in which a tip end surface of the first contact portion that contacts the first contact target is an inclined surface.

An electrical connecting structure according to a third aspect of the present disclosure is characterized by including a first contact target, a second contact target, and an electrical contactor that electrically contacts the first contact target and the second contact target, the electrical connecting structure electrically connecting the first contact target and the second contact target via the electrical contactor, in which the electrical contactor includes: a first contact portion that contacts the first contact target; a first elastic portion having a bamboo-shoot-like spring structure that elastically moves the first contact portion in an axial direction; a second contact portion that contacts the second contact target; a second elastic portion having a bamboo-shoot-like spring structure that elastically moves the second contact portion in the axial direction; and a coupling portion that couples the first elastic portion and the second elastic portion, the coupling portion enabling elasticity of each of the first elastic portion and the second elastic portion, in which a tip end surface of the first contact portion and/or the second contact portion and a surface of the first contact target and/or the second contact target are opposed while being tilted relative to each other, and in which, when the tip end surface of the first contact portion and the surface of the first contact target contact each other, while the tip end surface of the second contact portion and the surface of the second contact target contact each other, the electrical contactor is deformed to make an outer wall of an inner part of each of the first elastic portion and the second elastic portion electrically contactable with an inner wall of an outer part of each of the first elastic portion and the second elastic portion, respectively.

An electrical connecting apparatus according to a fourth aspect of the present disclosure is characterized by including a plurality of electrical contactors, each being configured to contact a first contact target and a second contact target, in which each of the plurality of electrical contactors is the electrical contactor according to the first or second aspect of the present disclosure.

Advantageous Effects of Invention

According to the present disclosure, the electrical contactor, the electrical connecting structure, and the electrical connecting apparatus are provided which are formed from a small number of components and can improve the conductivity in the electrical contactor, while improving the slidability of an elastic member and the electrical contact stability with a contact target.

BRIEF DESCRIPTION OF DRAWINGS

FIG. 4 is an explanatory diagram for explaining a method of manufacturing the connector of the first embodiment (Part 1);

FIG. 5 is an explanatory diagram for explaining the method of manufacturing the connector of the first embodiment (Part 2);

FIG. 8 is an explanatory diagram for explaining the configuration before and after deformation of the connector of the first embodiment, the configuration thereof in the planar view, and an electrical conduction path;

FIG. 9 is an explanatory diagram for explaining a contact state between a first inclined contact portion and a contact terminal according to a modified embodiment;

DESCRIPTION OF EMBODIMENTS (A) First Embodiment

Hereinafter, a first embodiment of an electrical contactor and an electrical connecting apparatus according to the present disclosure will be described in detail with reference to the figures.

The first embodiment illustrates a case where the electrical contactor according to the present disclosure is applied to a connector mounted on an electrical connection unit, which is a constituent member of the electrical connecting apparatus, as will be described later. The electrical contactor according to the present disclosure can be applied to an electrical contactor which comes into electrical contact with a first contact target and a second contact target and can thereby conduct an electrical signal between the first contact target and the second contact target. It is noted that although the first embodiment illustrates a case where the electrical contactor of the present disclosure is applied to the connector of the electrical connection unit, the present disclosure can also be applied to a probe or the like that is connected to an electrode terminal of an object to be inspected.

Further, the first embodiment illustrates a case where the electrical connecting apparatus according to the present disclosure is an electrical connecting apparatus that uses an integrated circuit formed on a semiconductor wafer as an object to be inspected so as to perform electrical inspection on the object to be inspected. It is noted that the electrical connecting apparatus according to the present disclosure can be applied to an electrical connecting apparatus that uses the electrical contactor according to the present disclosure to conduct an electrical signal between the first contact target and the second contact target, thereby causing the first and second contact targets to be electrically connected to each other.

(A-1) Configuration of First Embodiment

(A-1-1) Electrical Connecting Apparatus

Figure 3:
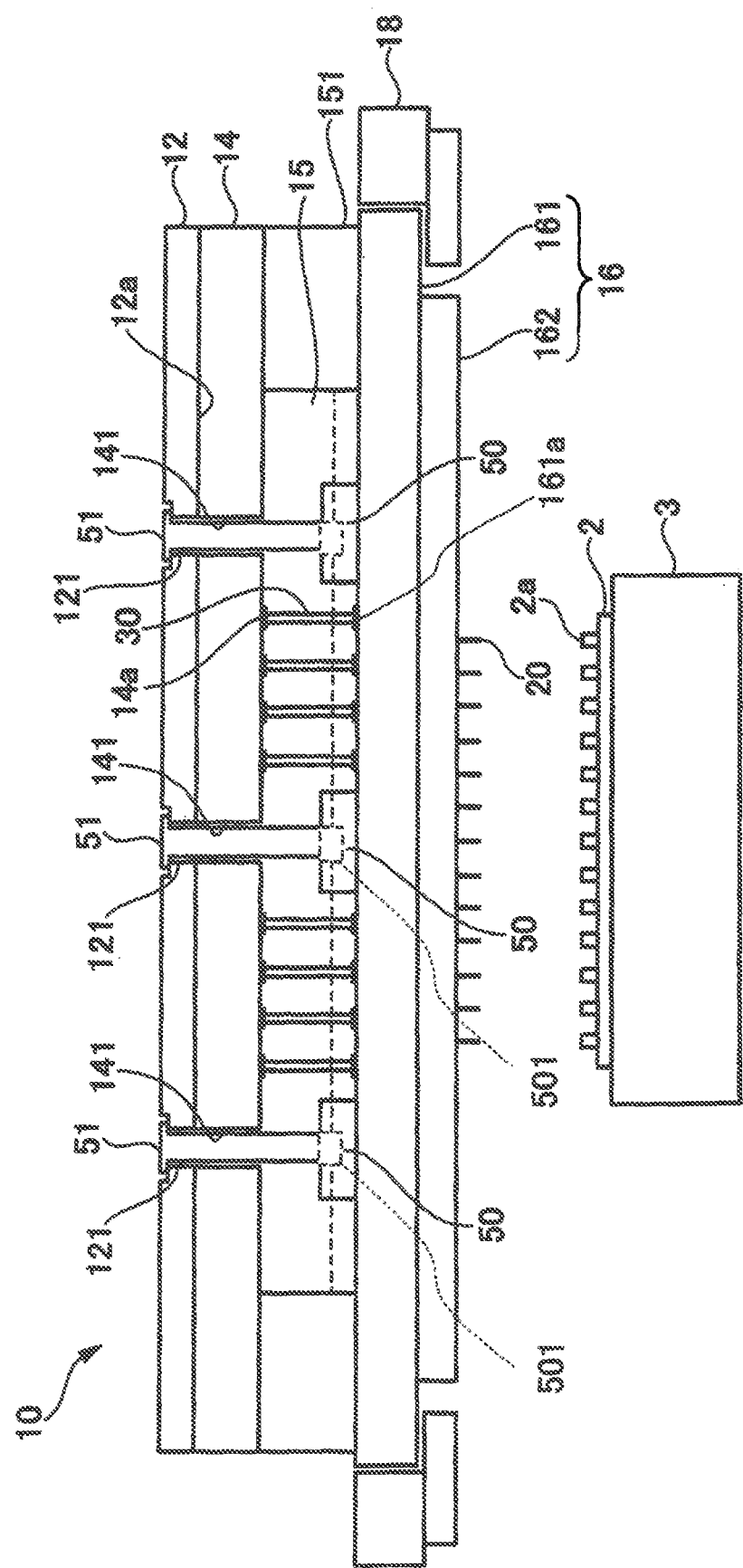
FIG. 3 is a configuration diagram showing a configuration of an electrical connecting apparatus according to the first embodiment.

FIG. 3 is a configuration diagram showing a configuration of the electrical connecting apparatus according to the first embodiment.

Although FIG. 3 shows main constituent members of the electrical connecting apparatus 10, the electrical connecting apparatus 10 is not limited to these constituent members, and in fact also includes other constituent members not shown in FIG. 3. Hereinafter, reference is made to "upper" and "lower" by focusing on the vertical direction in FIG. 3.

In FIG. 3, the electrical connecting apparatus 10 according to this embodiment includes: a flat plate-shaped support member 12; a flat plate-shaped wiring board 14 held on a lower surface 12a of the support member 12; an electrical connection unit 15 electrically connected to the wiring board 14; and a probe substrate 16 electrically connected to the electrical connection unit 15 and having a plurality of probes 20.

The electrical connecting apparatus 10 uses a number of fixing members (for example, screw members, such as bolts) when assembling the support member 12, the wiring board 14, the electrical connection unit 15, and the probe substrate 16, but the illustration of these fixing members is omitted in FIG. 3.

The electrical connecting apparatus 10 uses, for example, a semiconductor integrated circuit or the like formed on a semiconductor wafer, as an object 2 to be inspected, and performs electrical inspection on the object 2 to be inspected. Specifically, the object 2 to be inspected is pressed against the probe substrate 16, so that electrode terminals 2a on the object 2 to be inspected electrically contact the tip end portions of the respective probes 20 on the probe substrate 16. Subsequently, an electrical signal is supplied from a tester (i.e., an inspection device) (not shown) to each electrode terminal 2a of the object 2 to be inspected, and then the electrical signal from each electrode terminal 2a of the object 2 to be inspected is fed to the tester side, thereby performing the electrical inspection on the object 2 to be inspected.

The object 2 to be inspected, which is an inspection target, is placed on an upper surface of a chuck top 3. The position of the chuck top 3 can be adjusted in the horizontal X-axis direction, in the Y-axis direction perpendicular to the X-axis direction on a horizontal plane, and in the Z-axis direction perpendicular to the horizontal plane (X-Y plane), and the rotational posture of the chuck top 3 can also be adjusted in a θ direction about the Z-axis. When performing electrical inspection on the object 2 to be inspected, the chuck that can be raised and lowered in the vertical direction (in the Z-axis direction) is moved, so that the electrode terminals 2a of the object 2 to be inspected electrically contact the tip end portions of the respective probes 20 on the probe substrate 16. Thus, the lower surface of the probe substrate 16 in the electrical connecting apparatus 10 and the object 2 to be inspected on the upper surface of the chuck top 3 are moved so as to be relatively close to each other.

[Support Member]

The support member 12 is to suppress the deformation (for example, bending or the like) of the wiring board 14. For example, since the probe substrate 16 has a number of probes 20, the weight of the probe substrate 16 installed onto the wiring board 14 side becomes. When performing the electrical inspection on the object 2 to be inspected, the probe substrate 16 is pressed against the object 2 to be inspected on the chuck top 3, so that the tip end portions of the probes 20 protruding from the lower surface of the probe substrate 16 and the electrode terminals 2a on the object 2 to be inspected come into electrical contact with each other. In this way, during the electrical inspection, a reaction force (contact load) is applied to thrust upward from the bottom, whereby a large load is also applied onto the wiring board 14. The support member 12 functions as a member that suppresses the deformation (for example, bending or the like) of the wiring board 14.

In the support member 12, a plurality of through holes 121 is provided to penetrate the upper and lower surfaces of the support member 12. Each of the plurality of through holes 121 is provided at a position corresponding to the position of each of a plurality of anchors 50 disposed on an upper surface of the probe substrate 16 to be described later. Further, each of the through holes 121 is also provided at a position corresponding to the position of each of the plurality of through holes 141 provided in the wiring board 14.

A spacer 51 (hereinafter referred to as a "supporting portion") is inserted through each through hole 121 of the support member 12 from above to below the support member 12, so that a lower end portion of the spacer (the supporting portion) 51 can be fixed to the corresponding anchor 50. For example, the lower end portion of the spacer (the supporting portion) 51 is a male threaded portion, while the substantial center of the anchor 50 disposed on the upper surface of the probe substrate 16 is a female threaded portion 501. Thus, the lower end portion (the male threaded portion) of the spacer (supporting portion) 51 can be fixed to the female threaded portion 501 of the anchor 50 by being screwed. Thus, a distance between the upper surface of the probe substrate 16 and an upper surface of the support member 12 can be maintained at a predetermined length.

[Wiring Board]

The wiring board 14 is formed of a resin material such as polyimide and is a printed board or the like formed in a substantially circular-plate shape, for example. A number of electrode terminals (not shown) for electrical connection to a test head (not shown) of the tester (the inspection device) are disposed at a circumferential edge of an upper surface of the wiring board 14. A wiring pattern is formed at a lower surface of the wiring board 14, so that connection terminals 14a of the wiring pattern are electrically connected to upper ends of the connectors 30 provided in the electrical connection unit 15.

Further, a wiring circuit (not shown) is formed inside the wiring board 14. The wiring pattern on the lower surface of the wiring board 14 and the electrode terminals on the upper surface of the wiring board 14 can be connected together via the wiring circuit inside the wiring board 14. Therefore, the electrical signal can be conducted between each connector 30 of the electrical connection unit 15 electrically connected to the connection terminals 14a of the wiring pattern on the lower surface of the wiring board 14 and the test head connected to the electrode terminal on the upper surface of the wiring board 14, via the wiring circuit inside the wiring board 14. On the upper surface of the wiring board 14, a plurality of electronic components required for the electrical inspection of the object 2 to be inspected is also disposed.

In the wiring board 14, a plurality of through holes 141 is provided to penetrate the upper and lower surfaces of the wiring board 14. Each of the plurality of through holes 141 is disposed at a position corresponding to the position of each of the plurality of anchors 50 disposed on the upper surface of the probe substrate 16. Further, each of the through holes 141 is also disposed at a position corresponding to the position of each of the plurality of through holes 121 in the support member 12.

The opening shape of each through hole 141 can have a shape that corresponds to the shape of the supporting portion 51 to be inserted. To enable the supporting portion 51 to be inserted through each through hole 141, the inner diameter of each through hole 141 is substantially the same as or slightly larger than the outer diameter of the supporting portion 51.

Since in this embodiment, the supporting portion 51 is illustrated as a columnar member, the opening shape of the through hole 141 is substantially circular by way of example, but is not limited thereto. For example, the supporting portion 51 may be a member of a right prism whose cross-sectional shape is substantially square or the like, or a member of a polygonal prism whose cross-sectional shape is a polygon or the like. Even in such examples, the opening shape of the through hole 141 can be a shape through which the support portion 51 is insertable.

[Electrical Connection Unit]

The electrical connection unit 15 has a plurality of connectors 30. In an assembled state of the electrical connecting apparatus 10, the upper end portion of each connector 30 is electrically connected to the connection terminal 14a of the wiring pattern on the lower surface of the wiring board 14, while the lower end portion of each connector 30 is connected to a pad 161a provided on the upper surface of the probe substrate 16. Since the tip end portion of the probe 20 electrically contacts the electrode terminal of the object 2 to be inspected, the electrode terminal of the object 2 to be inspected is electrically connected to the tester (the inspection device) through the probe 20 and the connector 30, making it possible to perform the electrical inspection on the object 2 to be inspected using the tester (the inspection device).

For example, the electrical connection unit 15 has a plurality of insertion holes through which the respective connectors 30 are inserted. The upper and lower ends of the respective connectors 30 are protruded by inserting the connectors 30 through the respective insertion holes. It is noted that a mechanism designed to mount the plurality of connectors 30 in the electrical connection unit 15 is not limited to the configuration in which the through holes are provided, and various configurations are widely applicable to the mechanism. A flange 151 is provided around the electrical connection unit 15.

[Probe Substrate]

The probe substrate 16 is a substrate that has a plurality of probes 20, and is formed in a substantially circular or polygonal shape (for example, a hexadecagonal shape or the like). For example, a cantilever probe can be used as the probe 20, but the probe 20 is not limited thereto. The probe substrate 16 has a substrate member 161 formed from a ceramic plate, for example, and a multilayer wiring board 162 formed on the lower surface of the substrate member 161.

A number of conductive paths (not shown) that penetrate in the direction of the plate thickness are formed inside the substrate member 161, which is a ceramic substrate. Pads 161a are formed on an upper surface of the substrate member 161, so that one end of the conductive path in the substrate member 161 is formed so as to be connected to the corresponding pad 161a on the upper surface of the substrate member 161. Further, the lower surface of the substrate member 161 is formed so that the other end of the conductive path in the substrate member 161 is connected to the connection terminal provided on the upper surface of the multilayer wiring board 162.

The multilayer wiring board 162 is formed from a plurality of multilayer boards formed by synthetic resin members made of polyimide, for example, and a wiring path (not shown) is formed between the plurality of multilayer boards. One end of each wiring path in the multilayer wiring board 162 is connected to the other end of the conduction path on the side of the substrate member 161 which is the ceramic substrate, while the other end of the multilayer wiring board 162 is connected to the probe land provided on the lower surface of the multilayer wiring board 162. The plurality of probes 20 are disposed in the probe land provided on the lower surface of the multilayer wiring substrate 162, and the plurality of probes 20 on the probe substrate 16 are electrically connected to the corresponding connection terminals 14a of the wiring substrate 14 via the electrical connection unit 15.

(A-1-2) Connector (Electrical Contactor)

Figure 1:
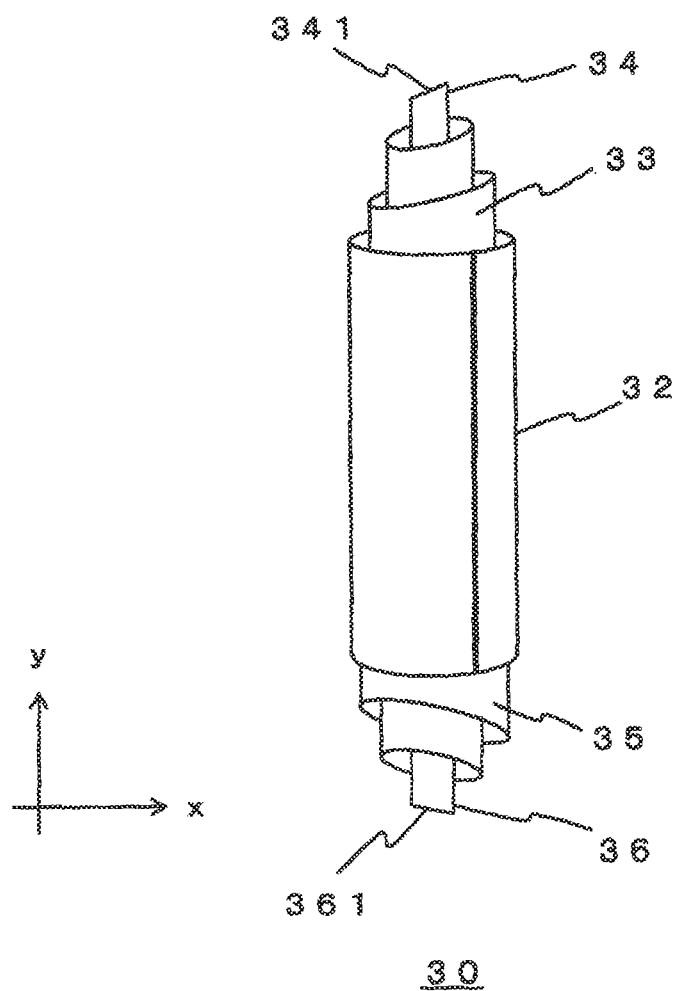
FIG. 1 is a configuration diagram showing a configuration of a connector according to a first embodiment.
Figure 2:
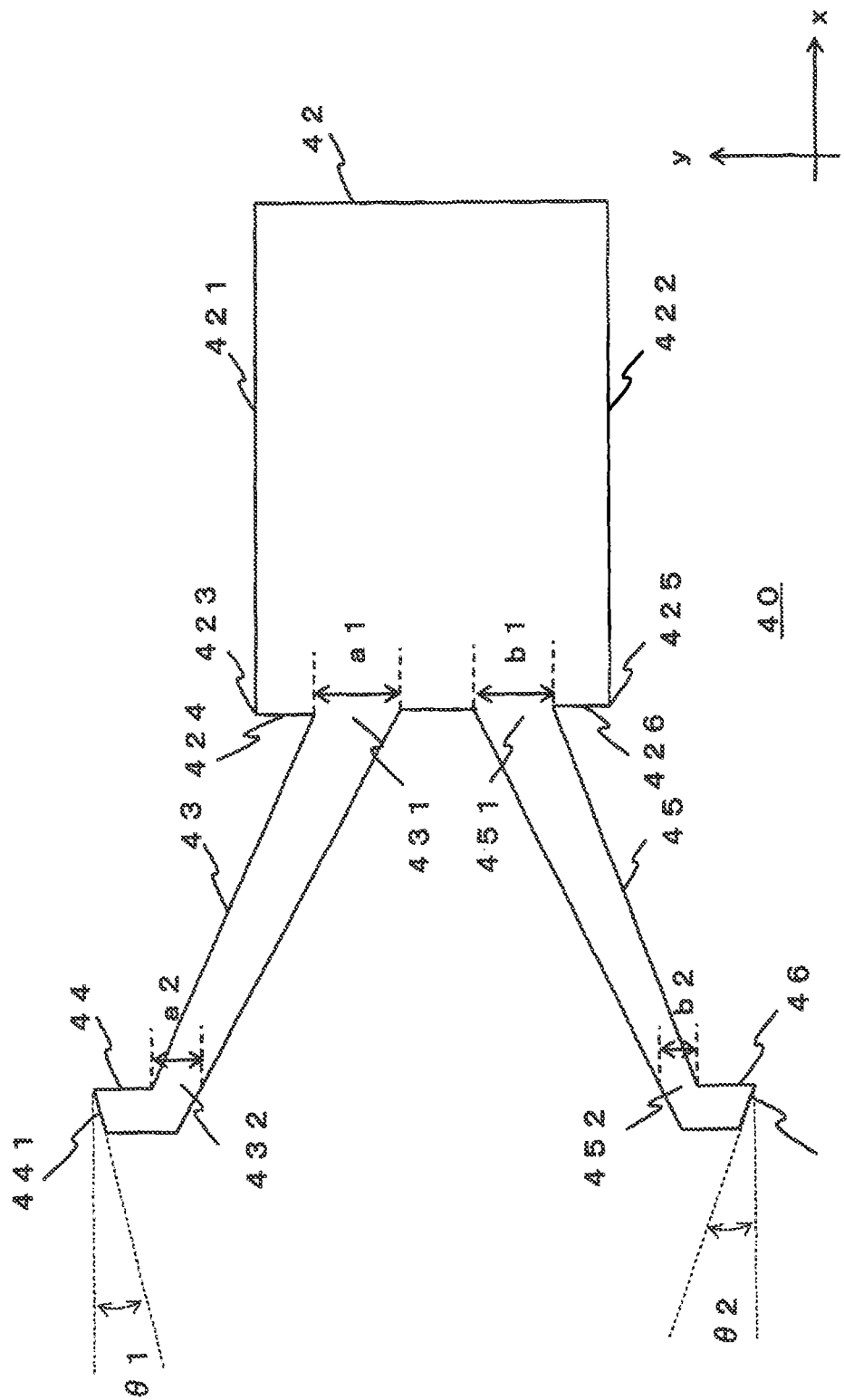
FIG. 2 is a configuration diagram showing a configuration of a plate-shaped member before formation of the connector of the first embodiment.

FIG. 1 is a configuration diagram showing a configuration of the connector 30 according to the first embodiment. FIG. 2 is a configuration diagram showing a configuration of a plate-shaped member before formation of the connector 30 of the first embodiment.

The connector 30 shown in FIG. 1 is formed by performing a forming process (for example, a roll-up process, a bending process, or the like) on a plate-shaped member 40 shown in FIG. 2. That is, the plate-shaped member 40 shown in FIG. 2 is a member before the molding process of the connector 30 shown in FIG. 1 and is a plate-shaped member formed of a conductive material. Therefore, the connector 30 is obtained by forming a single plate-shaped member and thereby it can stabilize the conductivity of the electrical signal. In other words, in the electrical contactor formed by combining a plurality of components, the electrical signal is conducted through the mutual contact between the plurality of components, so that a resistance becomes high at contact points between the plurality of components, which may make the conductivity unstable. In contrast, the connector 30 obtained by performing a forming process on the plate-shaped member can eliminate or lessen any contact points between the components, thereby making it possible to lessen the resistance value and to stabilize the conductivity of the electrical signal.

As shown in FIG. 1, the connector 30, which is an example of the electrical contactor, includes a cylindrical portion 32, a first contact portion 34, an upper elastic portion 33, a second contact portion 36, and a lower elastic portion 35. The first contact portion 34 contacts the connection terminal 14a of the wiring board 14 as the first contact target. The upper elastic portion 33 elastically urges the first contact portion 34 in the vertical direction when the first contact portion 34 contacts the connection terminal 14a to receive a load. The second contact portion 36 contacts the pad 161a on the substrate member 161 as the second contact target. The lower elastic portion 35 elastically urges the second contact portion 36 in the vertical direction when the second contact portion 36 contacts the pad 161a to receive a load.

The tip end of the first contact portion 34 has a tip end surface that contacts the first contact target (hereinafter also referred to as a "contact surface"), with the tip end surface being inclined. The tip end of the second contact portion 36 has a tip end surface that contacts the second contact target (hereinafter also referred to as a "contact surface"), with the tip end surface being inclined. Hereinafter, the inclined tip end surface at the tip end of the first contact portion 34 is referred to and described as a first inclined contact portion 341, whereas the inclined tip end surface at the tip end of the second contact portion 36 is referred to and described as a second inclined contact portion 361.

As shown in FIG. 2, the plate-shaped member 40 has a main body 42, an upper arm portion 43, a first tip end portion 44 provided at a tip end of the upper arm portion 43, a first inclined portion 441 provided at a tip end of the first tip end portion 44, a lower arm portion 45, a second tip end portion 46 provided at the tip end of the lower arm portion 45, and a second inclined portion 461 provided at the tip end of the second tip end portion 46.

The plate-shaped member 40 is, for example, a plate-shaped member formed of noble metal or other metals, or a plate-shaped member obtained by performing plating processing on the surface of the plate-shaped member with noble metal or other metals. The shape of the plate member 40 can be formed by a process of punching out the plate-shaped member or by other processes. For example, the plate-shaped member 40 may be formed of noble metal or the like at a portion thereof that contacts the first contact target and/or the second contact target (the first tip end portion 44 and/or the second tip end portion 46 as described later), while the other portions of the plate-shaped member 40 may be composed of an excellently elastic (for example, springy) member made of a bimetal or the like. In this way, the contact point which contacts the first contact target and/or the second contact target is formed of noble metal or the like, thereby enabling improvement of the conductivity, and the other portions are composed of a member made of, for example, a bimetal or the like, thereby enabling improvement of the elasticity (for example, springiness) of the other portions.

[Main Body]

The main body 42 is a plate-shaped portion having a substantially rectangular shape. As will be mentioned later, the plate-shaped member 40 is wound from the left constituent element side thereof by way of the roll-up process to form the connector 30. After the formation of the connector 30 is completed, the main body 42 becomes the cylindrical portion 32 which covers the upper arm portion 43 and the lower arm portion 45, which are wound.

Here, some of the end portions on the four sides of the main body 42, namely, an upper end portion 421 and a lower end portion 422 are formed linearly in the lateral direction and parallel to each other. The cylindrical portion 32 of the connector 30 which is formed by winding the plate-shaped member 40 functions as a positioning portion of the connector 30 in the height direction when housing the connector 30. Therefore, by making the end portions, namely, the upper end portion 421 and the lower end portion 422 of the main body 42 linear and parallel, the posture of the housed connector 30 can be stabilized.

[Upper Arm Portion]

The upper arm portion 43 is a member that is integrally coupled to one of the end portions (the left end portion in FIG. 2) from among the end portions on the four sides of the main body 42. The upper arm portion 43 is located in an upper part of the left end portion of the main body 42, and extends diagonally upward and leftward from the left end portion of the main body 42.

The upper arm portion 43 may have a tapered shape (may be tapered) such that its length decreases in the vertical direction (in the y direction) from a proximal end portion 431 coupled to the main body 42, toward its tip end side (i.e., toward the first tip end portion 44 side), or alternatively the upper arm portion 43 may have the same width from the proximal end portion 431 toward the tip end side thereof. The case of the tapered shape is illustrated in this embodiment. More specifically, when the length of the proximal end portion 431 of the upper arm portion 43 coupled to the main body 42 in the y direction is "a1", and the length of the proximal end portion 432 of the upper arm portion 43 in the y direction is "a2", the relationship of a1≥a2 is satisfied. The case where the upper arm portion 43 has a tapered shape is illustrated in this embodiment.

In this way, by forming the upper arm portion 43 in a tapered shape, the upper elastic portion 33 having, for example, a bamboo-shoot-like spring structure is formed when the upper arm portion 43 is wound by way of the roll-up process. That is, in the upper elastic portion 33 formed by winding the upper arm portion 43, a lower end portion of a wound inner part of the upper elastic portion 33 is brought into a state of being covered with an upper end portion of a wound outer part of the upper elastic portion 33. The upper elastic portion 33 elastically urges the first contact portion 34 in the vertical direction. Here, the bamboo-shoot-like spring is a conical spring formed by winding a plate-shaped member in a spiral shape and partially covering the wound inner part of the spiral wound member with the outer part thereof.

The proximal end portion 431 of the upper arm portion 43 extends from a position slightly below an upper corner 423 of the left end portion of the main body 42 (a position spaced apart from the upper corner 423). Here, a part of the left end portion of the main body 42 from the upper corner 423 to the proximal end portion 431 is referred to as a "step 424". In this way, by extending the upper arm portion 43 from the position where the step 424 is provided out of the upper corner 423, the proximal end portion 431 of the wound upper arm portion 43 (the upper elastic portion 33) is brought into a state of being covered with the main body 42 when the plate-shaped member 40 is wound by way of the roll-up process.

Then, when the connector 30 formed by winding the plate-shaped member 40 is housed in the electrical connection unit 15 and the first contact portion 34 receives a load, the upper elastic portion 33 elastically strokes in the vertical direction with the proximal end portion 431 of the upper elastic portion 33 enclosed in the cylindrical portion 32. Therefore, damage to the upper elastic portion 33, which is elastically driven as a spring, can be prevented.

[First Tip End Portion]

The first tip end portion 44 is a portion provided at the tip end of the upper arm portion 43 and extended vertically upward. By winding the first tip end portion 44 through the roll-up process, the wound first tip end portion 44 functions as the first contact portion 34 of the connector 30.

[First Inclined Portion]

The first inclined portion 441 is an inclined surface provided at the tip end of the first tip end portion 44. By winding the first tip end portion 44 through the roll-up process, the first inclined portion 441 functions as the first inclined contact portion 341 of the connector 30. The first inclined portion 441 is inclined at a predetermined angle (θ1 in an example of FIG. 2) with respect to the x direction. An inclination angle θ1 may be the same as or different from an inclination angle θ2 of the second inclined portion 461 of the lower arm portion 45, which will be described later. FIG. 2 illustrates an example in which the first inclined portion 441 is inclined diagonally upward and rightward, while a second inclined portion 461 to be mentioned later is inclined diagonally downward and rightward. The example illustrates a case where the inclination directions of the first inclined portion 441 and the second inclined portion 461 are symmetrical (linearly symmetrical with respect to a straight line in the x direction that passes through the midpoint of the plate-shaped member 40 in the y direction). More specifically, the first inclined portion 441 is inclined diagonally upward and leftward, while the second inclined portion 461 is inclined diagonally downward and leftward.

[Lower Arm Portion]

The lower arm portion 45 is a member that is integrally coupled to one of the end portions (the left end portion in FIG. 2) from among the end portions on the four sides of the main body 42. The lower arm portion 45 is located in a lower part of the left end portion of the main body 42, and extends diagonally downward and leftward from the left end portion of the main body 42. The proximal end portion 451 of the lower arm portion 45 is located below the position of the proximal end portion 431 of the upper arm portion 43. In the left end portion of the main body 42, the proximal end portion 451 of the lower arm portion 45 is spaced apart from the proximal end portion 431 of the upper arm portion 43.

Like the upper arm portion 43, the lower arm portion 45 may have a tapered shape (may be tapered) such that its length decreases in the vertical direction (in the y direction) from a proximal end portion 451 coupled to the main body 42 to its tip end side (i.e., toward the second tip end portion 46 side), or alternatively the lower arm portion 45 may have the same width from the proximal end portion 451 toward the tip end side. The case of the tapered shape is illustrated in this embodiment. More specifically, when the length of the proximal end portion 451 in the y direction of the lower arm portion 45 coupled to the main body 42 is "b1", and the length of the tip end portion 452 of the lower arm portion 45 in the y direction is "b2", the relationship of b1≥b2 is satisfied.

In this way, by forming the lower arm portion 45 in a tapered shape, the lower elastic portion 35 having, for example, a bamboo-shoot-like spring shape is formed when the lower arm portion 45 is wound by way of the roll-up process. That is, in the lower elastic portion 35 formed by winding the lower arm portion 45, an upper end portion of a wound inner part of the lower elastic portion 35 is brought into a state of being covered with a lower end portion of a wound outer part of the lower elastic portion 35. The lower elastic portion 35 elastically urges the second contact portion 36 in the vertical direction.

The proximal end portion 451 of the lower arm portion 45 extends from a position slightly above a lower corner 425 of the left end portion of the main body 42 (a position spaced apart from the lower corner 425). Here, a part of the left end portion of the main body 42 from the lower corner 425 to the proximal end portion 451 is referred to as the "step 426". In this way, by extending the lower arm portion 45 from the position where the step 426 is provided out of the lower corner 425, the proximal end portion 451 of the wound lower arm portion 45 (the lower elastic portion 35) is brought into a state of being covered with the main body 42 when the plate-shaped member 40 is wound by way of the roll-up process.

Then, when the connector 30 formed by winding the plate-shaped member 40 is housed in the electrical connection unit 15 and the second contact portion 36 receives a load, the lower elastic portion 35 elastically strokes in the vertical direction with the proximal end portion 451 of the lower elastic portion 35 enclosed in the cylindrical portion 32. Therefore, damage to the lower elastic portion 35, which is elastically driven as a spring, can be prevented.

[Second Tip End Portion]

The second tip end portion 46 is a portion provided at the tip end of the lower arm portion 45 and extended vertically downward. By winding the second tip end portion 46 through the roll-up process, the wound second tip end portion 46 functions as the second contact portion 36 of the connector 30.

[Second Inclined Portion]

The second inclined portion 461 is an inclined surface provided at the tip end of the second tip end portion 46. By winding the second tip end portion 46 through the roll-up process, the second inclined portion 461 functions as the second inclined contact portion 361 of the connector 30. The second inclined portion 461 is inclined at a predetermined angle ($\theta 2$ in an example of FIG. 2) with respect to the x direction.

[Method of Manufacturing Connector]

FIGS. 4 and 5 are explanatory diagrams for explaining a method of manufacturing the connector 30 of the embodiment. In FIG. 4(A), first, the first tip end portion 44 and the second tip end portion 46 of the plate-shaped member 40 are subjected to the roll-up process, and then the first tip end portion 44 having the first inclined portion 441 on its tip end is wound to form the first contact portion 34 that has a first inclined contact portion 341 on its tip end. Similarly, the second contact portion 36 having the second inclined contact portion 361 on its tip end is formed by winding the second tip end portion 46 having the second inclined portion 461 on its tip end.

Here, when the connector 30 is formed by winding the plate-shaped member 40, the inclination directions of the first inclined contact portion 341 and the second inclined contact portion 361 are desirably symmetrical (linearly symmetrical). Therefore, when winding the first tip end portion 44 and the second tip end portion 46, the first inclined portion 441 and the second inclined portion 461 are wound in the same manner without rolling up parts of the first and second inclined portions 441 and 461. In other words, the first inclined contact portion 341 and the second inclined contact portion 361 of the connector 30 are formed while utilizing the inclinations of the first inclined portion 441 and the second inclined portion 461. Thus, the first inclined contact portion 341 and the second inclined contact portion 361 become inclined surfaces.

In FIG. 4(A), the upper arm portion 43 and the lower arm portion 45 are subjected to the roll-up process, and wound from the tip end sides of the upper arm portion 43 and the lower arm portion 45 toward the proximal end portions 431 and 451, respectively. Here, for example, the case of winding the upper and lower arm portions counterclockwise is illustrated in the planar views of FIGS. 4 and 5. When the upper arm portion 43 and the lower arm portion 45 are wound, their central axes pertaining to the winding coincide or substantially coincide with each other. The numbers of windings of the upper arm portion 43 and the lower arm portion 45 may be the same number.

The upper arm portion 43 and the lower arm portion 45 each have a tapered shape (are tapered) from the proximal end portions 431 and 451 toward their tip end sides, respectively. Thus, by repeatedly winding the upper arm portion 43 and the lower arm portion 45, a part of the lower end portion of the inner part of the upper elastic portion 33 is covered with the upper end portion of the outer part of the upper elastic portion 33, while a part of the upper end portion of the inner part of the lower elastic portion 35 is covered with the lower end portion of the outer part of the lower elastic portion 35, thereby forming the upper elastic portion 33 and the lower elastic portion 35. In this way, the upper elastic portion 33 and the lower elastic portion 35 each having the bamboo-shoot-like spring structure are formed.

As shown in FIG. 4(B), when the upper arm portion 43 and the lower arm portion 45 are wound up to the proximal end portions 431 and 451 to form the upper elastic portion 33 and the lower elastic portion 35, then the upper elastic portion 33 and the lower elastic portion 35 are further subjected to the roll-up process and rolled up into the cylindrical shape so as to wrap the proximal end portions 431 and 451 of the upper and lower elastic portions 33 and 35 by the main body 42.

As shown in FIG. 5(A), the proximal end portion 431 of the upper arm portion 43 extends from the position where the step 424 is provided out of the upper corner 423, while the proximal end portion 451 of the lower arm portion 45 extends from the position where the step 426 is provided out of the lower corner 425, which brings the proximal end portions 431 and 451 of the upper elastic portion 33 and the lower elastic portion 35 into a state of being covered with the inside of the main body 42 wound in the cylindrical shape.

Then, as shown in FIG. 5(B), when the rest of the main body 42 is wound to form the cylindrical portion 32, the connector 30 is formed. The connector 30 is formed by winding the plate-shaped member 40 made of a conductive material in this way, and thereby can stabilize the conductivity of the electrical signal. It is noted that the end of the main body 42 may be fixed to an inner surface of the main body 42. That is, to maintain the external structure of the cylindrical portion 32 which has been formed by winding the main body 42, one or more points where the end portion of the main body 42 contacts the cylindrical portion 32 may be fixed, for example, by welding or an adhesive. It is noted that a fixing method of the external structure of the cylindrical portion 32 is not limited to welding or an adhesive, and may be crimping or the like.

[Electrical Conduction Path]

Next, the electrical conduction path in the connector 30 provided when an electrical signal is applied between the first contact target and the second contact target via the connector 30 of the first embodiment will be described with reference to the figures.

Figure 6:
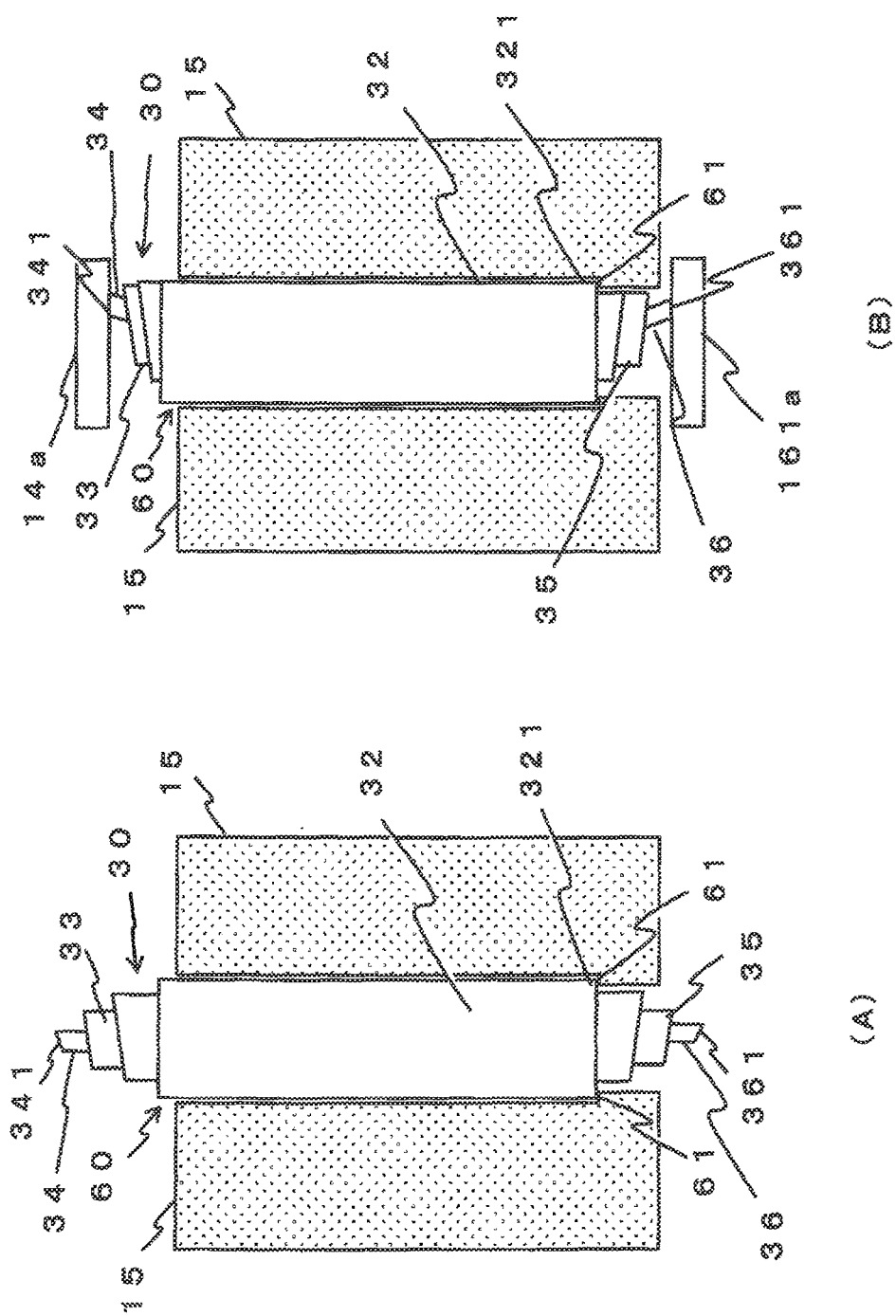
FIG. 6 is a diagram illustrating a housing state of the connector of the first embodiment and its state when receiving a load.
Figure 7:
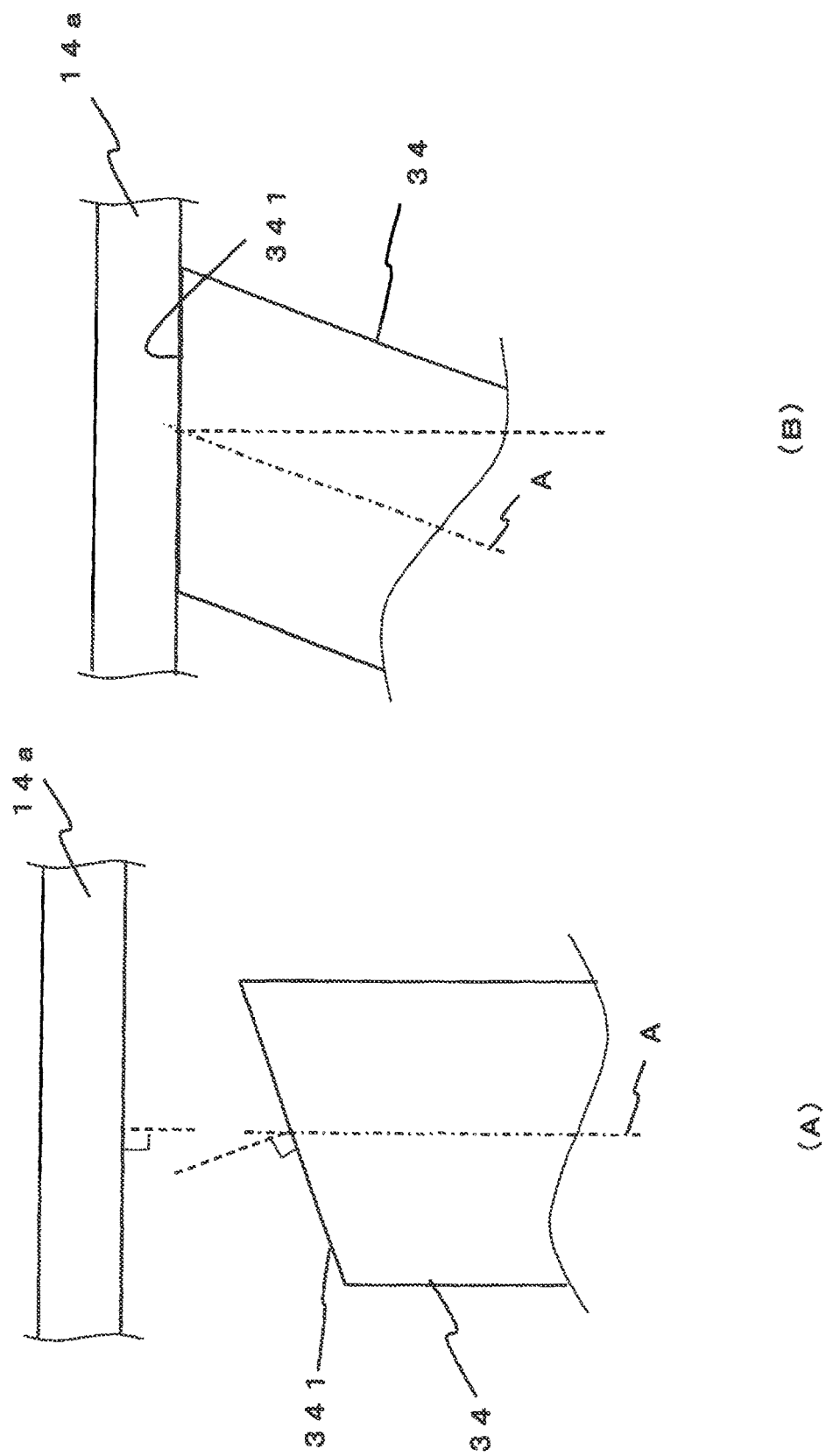
FIG. 7 is an explanatory diagram for explaining a contact state between a first inclined contact portion and a contact terminal according to a first embodiment.

FIG. 6 is a diagram illustrating a housing state of the connector 30 of the first embodiment and its state when receiving a load. It is noted that the housing method and housing structure of the connector 30 are illustrative only and are not limited to the structure shown in FIG. 6. FIG. 7 is an explanatory diagram for explaining a contact state between the first inclined contact portion and the contact terminal according to the first embodiment. FIG. 8(A) is a diagram showing the configuration before deformation of the connector and the configuration thereof in the planar view, and FIG. 8(B) is an explanatory diagram for explaining the electrical conduction path while showing the configuration after the deformation of the entire connector and the configuration thereof in the planar view.

As shown in FIG. 6(A), the electrical connection unit 15 is provided with a through hole 60 through which the connector 30 is inserted. The connector 30 is inserted through the through hole 60, so that the connector 30 is accommodated in the through hole 60. The inner diameter of the through hole 60 is slightly greater than or substantially equal to the outer diameter of the connector 30. A lower portion of the through hole 60 has an inner diameter slightly smaller than the inner diameter of an upper portion of the through hole 60, and a step 61 is provided on the inner surface of the through hole 60. A lower end 321 of the cylindrical portion 32 of the inserted connector 30 is supported by the step 61 on the inner surface of the through hole 60. The lower end 321 of the cylindrical portion 32 of the connector 30 is a flat end surface and is supported by the step 61, causing the inserted connector 30 to be accommodated in a stable posture.

FIG. 6(B) shows a state in which the connector 30 inserted through the through hole 60 receives a load when coming into contact with the connection terminal 14a as the first contact target and the pad 161a as the second contact target. That is, this is the state in which the first contact portion 34 of the connector 30 contacts the connection terminal 14a, causing the upper elastic portion 33 to receive the compression load, while the second contact portion 36 contacts the pad 161a, causing the lower elastic portion 35 to receive the compression load.

The upper elastic portion 33 and the lower elastic portion 35 which are positioned on both ends of the connector 30 in the axial direction (the vertical direction) are formed asymmetrically from each other, so that the upper elastic portion 33 and the lower elastic portion 35 independently have elasticity in the vertical direction.

Since the proximal end portion 431 of the upper elastic portion 33 having the bamboo-shoot-like spring structure is inside the cylindrical portion 32, the upper elastic portion 33 that receives the load becomes elastic in the vertical direction with its proximal end portion inside the cylindrical portion 32 acting as the end having the spring function. Likewise, since the proximal end portion 451 of the lower elastic portion 35 is inside the cylindrical portion 32, the lower elastic portion 35 that receives the load becomes elastic in the vertical direction with its proximal end portion 451 inside the cylindrical portion 32 acting as the end having the spring function. Thus, the cylindrical portion 32 can restrict the stroke of the vertical movement of each of the upper elastic portion 33 and the lower elastic portion 35 which receive the load, thereby preventing the damage to the upper elastic portion 33 and the lower elastic portion 35 as the spring function.

Here, the respective contact surfaces of the connection terminal 14a and the pad 161a, which are shown in FIG. 6(B), are flat surfaces. In contrast, the first inclined contact portion 341 and the second inclined contact portion 361 which are contact surfaces of the first contact portion 34 and the second contact portion 36, respectively, are inclined surfaces.

That is, the contact surface (the surface) of the connection terminal 14a and the contact surface (the first inclined contact portion 341) of the first contact portion 34 are opposed while being tilted relative to each other. In other words, although in an example shown in FIG. 7(A), a straight line A (hereinafter also referred to as a "central axis A") in the axial direction of the connector 30 coincides with the normal line of the surface of the connection terminals 14a (the line perpendicular to the surface thereof), the contact surface (the surface) of the connection terminal 14a is opposed to the contact surface (the first inclined contact portion 341) of the first contact portion 34 such that the normal line of the tip end surface of the first contact portion 34 differs from the normal line of the surface of the connection terminal 14a. It is noted that the same goes for the relative relationship between the contact surface (the surface) of the second contact portion and the contact surface (the second inclined contact portion 361) of the second contact portion 36.

As shown in FIGS. 7(A) and 7(B), the first inclined contact portion 341 of the first contact portion 34 is in contact with the connection terminal 14a having a flat surface in a state of being tilted. Likewise, since the second inclined contact portion 361 of the second contact portion 36 is also an inclined surface, the second inclined contact portion 361 contacts the pad 161a with a flat surface in a state of being tilted.

As shown in FIGS. 6(B), 7(B), and 8(B), when the first inclined contact portion 341 and the second inclined contact portion 361 come into surface contact with the connection terminal 14a and pad 161a, respectively, the first contact portion 34 and the second contact portion 36 are tilted to apply a bending load, causing the entire connector 30 to bend (deform) slightly. Thus, the upper elastic portion 33 and the lower elastic portion 35 move to the side in one direction (for example, to the right side of FIG. 6(B)) inside the cylindrical portion 32 and electrically contact the inner surface of the cylindrical portion 32. Further, in each of the upper elastic portion 33 and the lower elastic portion 35, an outer wall of the lower end portion of the inner part of the elastic portion become electrically contactable with an inner wall of the upper end portion of the outer part of the elastic portion.

In other words, the first inclined contact portion 341 and the second inclined contact portion 361 are electrically contactable with the first and second contact targets, respectively. Furthermore, the entire connector 30 is deformed, so that the outer wall of the inner part of each of the upper elastic portion 33 and the lower elastic portion 35 becomes electrically contactable with the inner wall of the outer part of the elastic portion, while the upper elastic portion 33 and the lower elastic portion 35 also become electrically contactable with the inner surface of the cylindrical portion 32. That is, the constituent members of the connector 30 are moved to and are densely located on one side (the right side in FIG. 8(B)), enabling the electrical contact.

In this way, due to the deformation of the connector 30, respective parts of each of the upper elastic portion 33 and the lower elastic portion 35 partly establish electrical contact, and furthermore, the upper elastic portion 33 and the lower elastic portion 35 electrically contact the inner surface of the cylindrical portion 32. Thus, the connector 30 is formed in a spiral shape by winding the plate-shaped member 40, but the electrical conduction path R becomes a path that is substantially linear in the vertical direction between the first contact target and the second contact target (see FIG. 8(B)).

More specifically, the electrical conduction path R is as follows: "the connection terminal 14a"⇔"the first inclined contact portion 341"⇔"the contact point between the first contact portion 34 and the upper elastic portion 33"⇔"the contact point between the parts of the upper elastic portion 33"⇔"the cylindrical portion 32"⇔"the contact point between the parts of the lower elastic portion 35"⇔"the contact point between the lower elastic portion 35 and the second contact portion 36"⇔"the second inclined contact portion 361"⇔"the pad 161a". Thus, the electrical conduction path R is the shortest path between the first contact target and the second contact target through the connector 30.

The strokes of the upper elastic portion 33 and the lower elastic portion 35 caused when they receive the load can be adjusted by adjusting the vertical height lengths of the upper elastic portion 33 and the lower elastic portion 35 protruding from the cylindrical portion 32. In other words, since the movable stroke is large, the degree of urging force of the connector 30 can be set in a wide range depending on the magnitude of the contact load with the contact target.

Furthermore, the vertical length (height) of the cylindrical portion 32 does not change, which can ensure that the connector 30 is positioned in the height direction.

The upper elastic portion 33 and the lower elastic portion 35 each function as the bamboo-shoot-like spring, thereby making it possible to improve the slidability of the upper elastic portion 33 and the lower elastic portion 35 which receive the load and operate in the vertical direction. That is, when the connector is formed from a plurality of components, the load acts between the plurality of components, so that the connector exhibits the elasticity in the vertical direction, which may lead to failure in sliding. However, the connector 30 of this embodiment has a structure in which the number of components is fewer than that of a conventional connector and thereby slidability is improved.

(A-2) Effects of First Embodiment

As described above, the electrical contactor (connector) of the first embodiment is composed fewer components than that in the conventional electrical contactor, and thereby can improve the slidability and can also improve the electrical contact stability with the contact target.

According to the first embodiment, the tip ends of the first contact portion and the second contact portion are formed as the first inclined contact portion and the second inclined contact portion, respectively, which are inclined surfaces. Because of this, when the electrical contactor comes into contact with the first contact target and the second contact target, the entire electric contactor is deformed, so that the parts forming the upper elastic portion and the lower elastic portion of the bamboo-shoot-like spring structure are electrically contacted with each other, and the upper elastic portion and the lower elastic portion electrically contact the inner surface of the cylindrical portion. Thus, the electrical conduction path via the electrical contactor is shortened. As a result, the resistance value of the electrical conduction path becomes low, thereby improving the electrical conductivity.

(B) Second Embodiment

Next, a second embodiment of an electrical contactor and an electrical connecting apparatus according to the present disclosure will be described in detail with reference to the figures.

(B-1) Configuration of Second Embodiment

Figure 10:
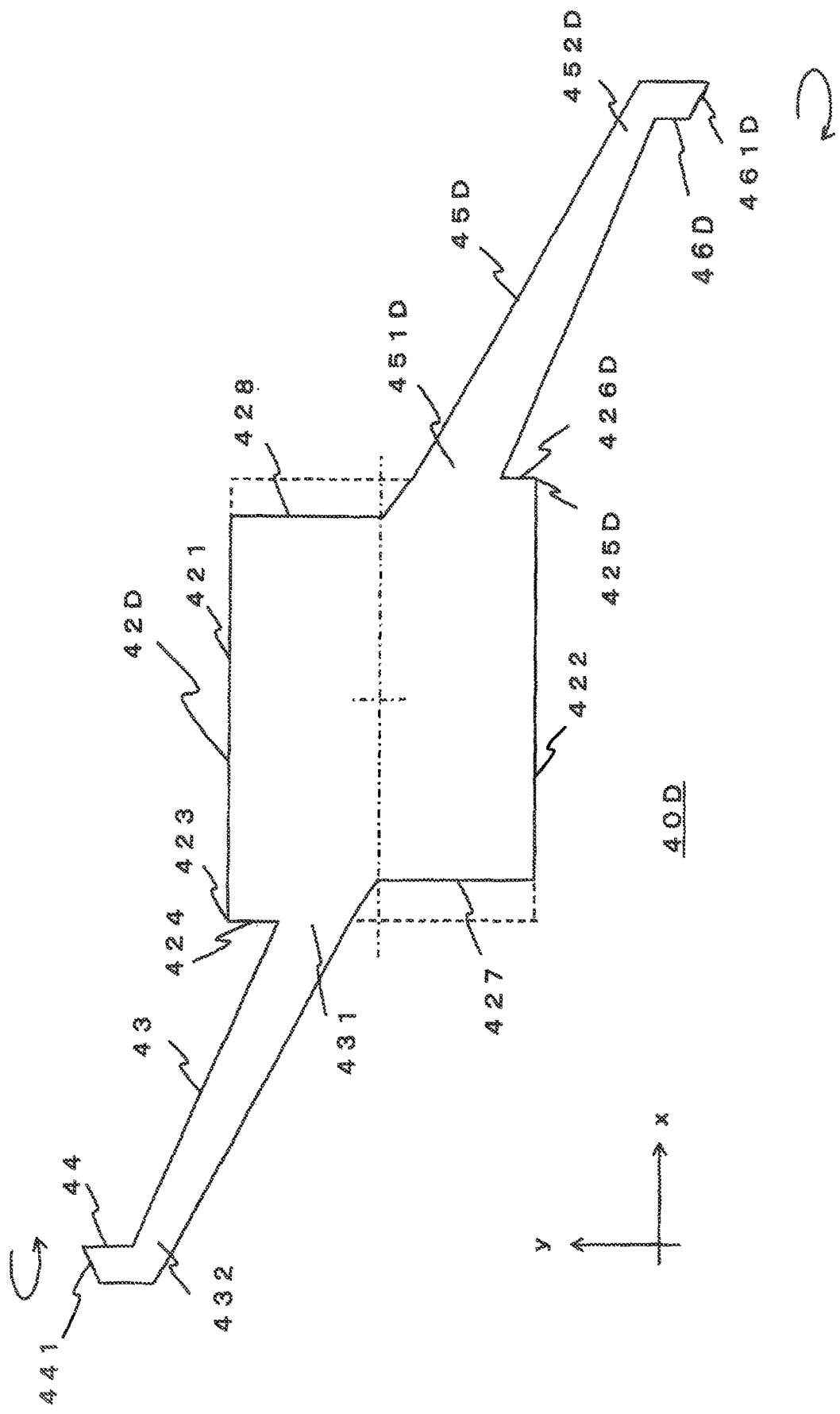
FIG. 10 is a configuration diagram showing a configuration of a plate-shaped member before formation of an electrical contactor of a second embodiment.
Figure 11:
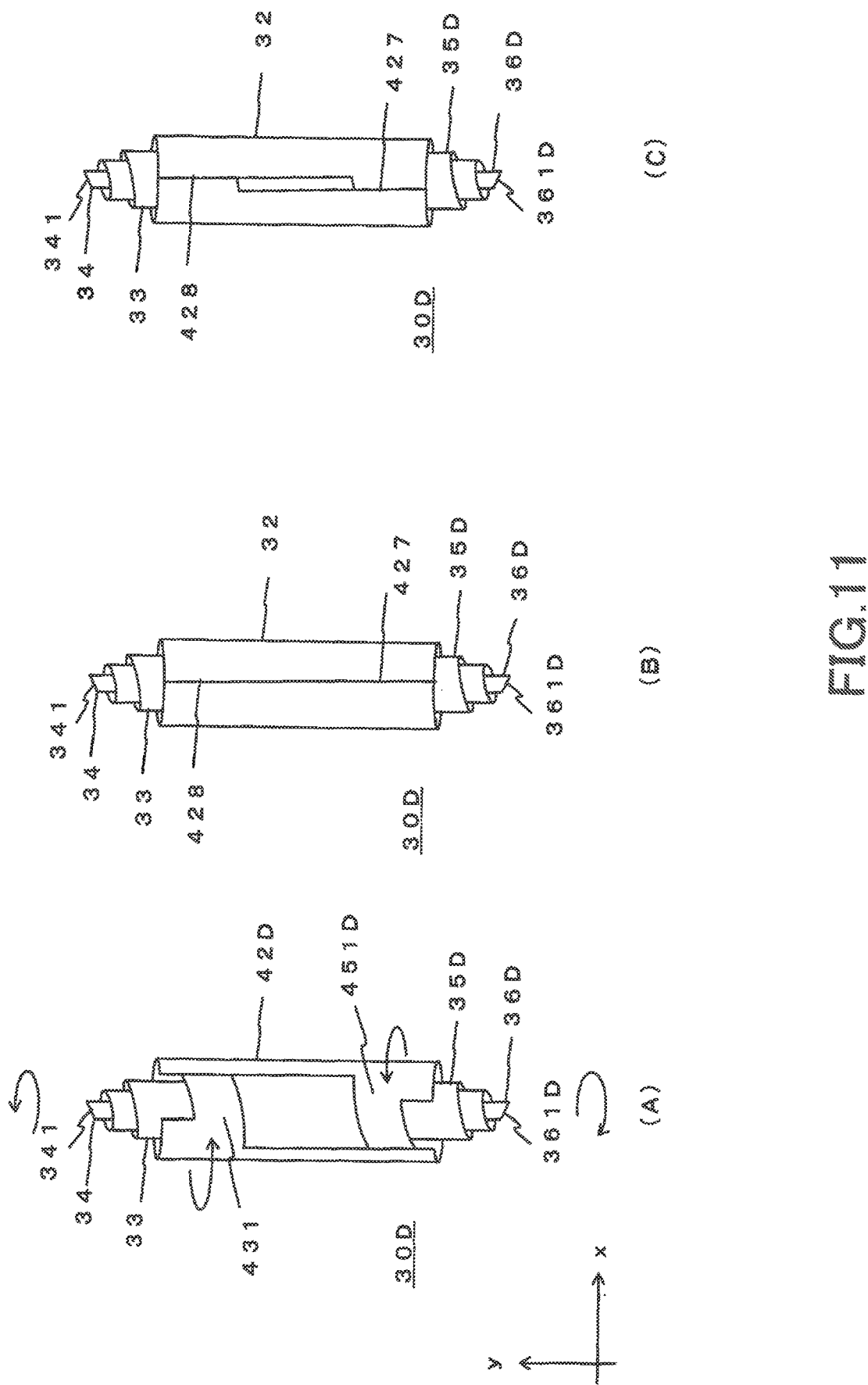
FIG. 11 is a configuration diagram showing a configuration of the electrical contractor according to the second embodiment.

FIG. 10 is a configuration diagram showing a configuration of a plate-shaped member before formation of the electrical contactor of the second embodiment. FIG. 11 is a configuration diagram showing a configuration of the electrical contractor according to the second embodiment.

As shown in FIG. 10, the plate-shaped member 40D of the second embodiment has a main body 42D, an upper arm portion 43 extending diagonally upward and leftward from an upper part on the left end portion of the main body 42D, a first tip end portion 44 provided at the tip end of the upper arm portion 43, a lower arm portion 45D extending diagonally downward and rightward from a lower part on the right end portion of the main body 42D, and a second tip end portion 46D provided at the tip end of the lower arm portion 45D.

Also, in the second embodiment, the tip end surface of the first tip end portion 44 has a first inclined portion 441 having an inclined surface, while the tip end surface of the second tip end portion 46D has a second inclined portion 461D having an inclined surface.

It is noted that in the plate-shaped member 40D of the second embodiment, the upper arm portion 43, and the first tip end portion 44 and the first inclined portion 441 which are provided at the tip end of the upper arm portion 43 are the same as the respective constituent elements described in the first embodiment and are therefore denoted by the same reference signs.

The plate-shaped member 40D is, for example, a plate-shaped member formed of noble metal or other metals, or a plate-shaped member obtained by plating the surface of the plate-shaped member with noble metal or other metals, like the first embodiment. The plate-shaped member 40D is produced by punching out the plate-shaped member or the like. For example, the plate-shaped member 40D may be formed of noble metal or the like at portions thereof that contact the first contact target and/or the second contact target, while the other portions of the plate-shaped member 40D may be composed of an excellently elastic (for example, springy) member made of a bimetal or the like.

The lower arm portion 45D is integrally coupled to the opposed end portion (the right end portion) that is opposed to the end portion (the left end portion) provided with the upper arm portion 43, from among the end portions on the four sides of the main body 42D. The lower arm portion 45D extends diagonally downward and rightward from the right end portion of the main body 42.

The lower arm portion 45D has a tapered shape (is tapered) such that the length of its vertical width decreases from a proximal end portion 451D on the main body 42D side to its tip end side, like the first embodiment. Also, in the second embodiment, like other embodiments, the proximal end portion 451D of the lower arm portion 45D extends from a position slightly below the proximal end portion 431 of the upper arm portion 43 and also extends from a position slightly above a lower corner 425D of the right end portion of the main body 42 with respect to the main body 42D. Here, a part of the left end portion of the main body 42D from the lower corner 425D to the proximal end portion 451D is referred to as a "step 426D".

The second tip end portion 46D is a portion provided at the tip end of the lower arm portion 45D and extended vertically downward.

The main body 42D basically has a substantially rectangular shape as in the first embodiment, but the position of a lower end 427 of the proximal end portion 431 of the upper arm portion 43 is located closer to the center of the main body 42 than the position of the step 424 above the proximal end portion 431 of the upper arm portion 43. Likewise, in the main body 42D, the position of an upper end 428 of the proximal end portion 451D of the lower arm portion 45D is located closer to the center of the main body 42D than the position of the step 426D below the lower arm portion 45D.

In this way, the position of each of the lower end 427 of the upper arm portion 43 and the upper end 428 of the lower arm portion 45D is located closer to the center of the main body 42D. Thus, interference between the wound upper arm portion 43 (or lower arm portion 45D) and the end portion (opposed end portion) of the main body 42D opposed thereto can be avoided when forming the cylindrical portion 32 of an electrical contactor 30D by the roll-up process. That is, making the position of each of the lower end 427 of the upper arm portion 43 and the upper end 428 of the lower arm portion 45D closer to the center of the main body 42D forms an escape structure.

In the second embodiment, the winding direction of the upper arm portion 43 and the winding direction of the lower arm portion 45D are different from each other. For example, the winding direction of the upper arm portion 43 is counterclockwise in the planar view of FIG. 10, while the winding direction of the lower arm portion 45D is clockwise in the planar view of FIG. 10.

First, the upper arm portion 43 is subjected to the roll-up process to thereby wind the upper arm portion 43 counterclockwise, while the lower arm portion 45D is subjected to the roll-up process to thereby wind the lower arm portion 45D clockwise.

Then, when the upper elastic portion 33 is formed by winding the upper arm portion 43 while the lower elastic portion 35D is formed by winding the lower arm portion 45D, the main body 42D is wound evenly from each of the left and right sides of the main body 42D, toward the center indicated by the dashed-dotted line (the center line). Consequently, the electrical contactor 30D illustrated in FIG. 11(A) is formed.

Here, a formation method of the cylindrical portion 32 will be described with reference to FIGS. 11(A) and 11(B). The proximal end portion 431 of the upper elastic portion 33 formed by winding the upper arm portion 43 is wound so as to be wrapped by the left part of the main body 42D coupled to the proximal end portion 431. That is, the proximal end portion 431 of the upper elastic portion 33 is wound inside the left part of the main body 42D. Similarly, the proximal end portion 451D of the lower elastic portion 35D formed by winding the lower arm portion 45D is wound so as to be wrapped by the right part of the main body 42D coupled to the proximal end portion 451D.

In this way, the upper elastic portion 33 is wound into the left part of the main body 42D, and concurrently the lower elastic portion 35D is wound into the right part of the main body 42D, causing the left end portion and the right end portion of the main body 42D to overlap (or contact) each other, thereby forming the cylindrical portion 32. That is, the upper elastic portion 33 is covered so as to be wrapped by the back side of the upper end 428 on the right end portion of the main body 42D, while the lower elastic portion 35D is covered so as to be wrapped by the back side of the lower end 427 on the left end portion of the main body 42D. Consequently, the electrical contactor 30D illustrated in FIG. 11(B) is formed. It is noted that in FIG. 11(B), the cylindrical portion 32 formed from the main body 42D is illustrated to have a structure which contacts the left end portion and the right end portion of the main body 42D, but is not limited thereto.

As illustrated in FIG. 11(C), the left end portion and the right end portion of the main body 42D may be opposed while being spaced slightly away from each other. In FIGS. 11(A) to 11(C), to maintain the external structure of the cylindrical portion 32 when forming the cylindrical portion 32 by winding the main body 42D, any one or more optional points of the left end portion and/or right end portion of the main body 42D may be fixed, for example, by welding or an adhesive. For example, in FIG. 11(B), one or more points where the left end portion and right end portion of the main body 42D contact each other may be fixed, for example, by welding or an adhesive, whereas in FIG. 11(C), one or more points where the left end portion (and/or the right end portion) of the main body 42D and the end of the cylindrical portion 32 opposed thereto contacts each other may be fixed, for example, by welding or an adhesive. It is noted that a fixing method of the external structure of the cylindrical portion 32 is not limited to welding or an adhesive, and may be crimping or the like.

Since the upper arm portion 43 and the lower arm portion 45D extend at positions that are displaced in the height direction with respect to the main body 42D, the upper elastic portion 33 and the lower elastic portion 35D do not interfere with each other even when the upper elastic portion 33 and the lower elastic portion 35D are wound to be wrapped by the main body 42D. As a result, the upper elastic portion 33 and the lower elastic portion 35D of the electric contactor 30D independently have elasticity in the axial direction.

By making the winding directions of the upper arm portion 43 and the lower arm portion 45D different from each other in this way, the stress acting on the upper elastic portion 33 and the stress acting on the lower elastic portion 35D can be canceled out when the first contact portion 34 is in contact with the first contact target while the second contact portion 36D is in contact with the second contact target to thereby apply a load to the first and second contact portions. Therefore, this can reduce the rotational load generated on the contact point when the first contact portion 34 contacts the first contact target and the contact point when the second contact portion 36D contacts the second contact target.

When the first inclined contact portion 341 of the first contact portion 34 contacts the first contact target and the second inclined contact portion 361D of the second contact portion 36D contacts the second contact target, the entire electrical contactor 30D is deformed as in the first embodiment, so that the constituent members of the upper elastic portion 33 and the lower elastic portion 35D become electrically contactable on one side. Therefore, the substantially linear conduction path is formed between the first contact target and the second contact target, improving the electrical conductivity.

(B-2) Effects of Second Embodiment

As described above, according to the second embodiment, the effects described in the first embodiment are obtained, and the stress acting on the upper elastic portion and the stress acting on the lower elastic portion can be canceled out by making the winding directions of the upper and lower arm portions different from each other, thereby reducing the rotational load on the contact point.

(C) Third Embodiment

Next, a third embodiment of an electrical contactor and an electrical connecting apparatus according to the present disclosure will be described in detail with reference to the figures.

(C-1) Configuration of Third Embodiment

Figure 12:
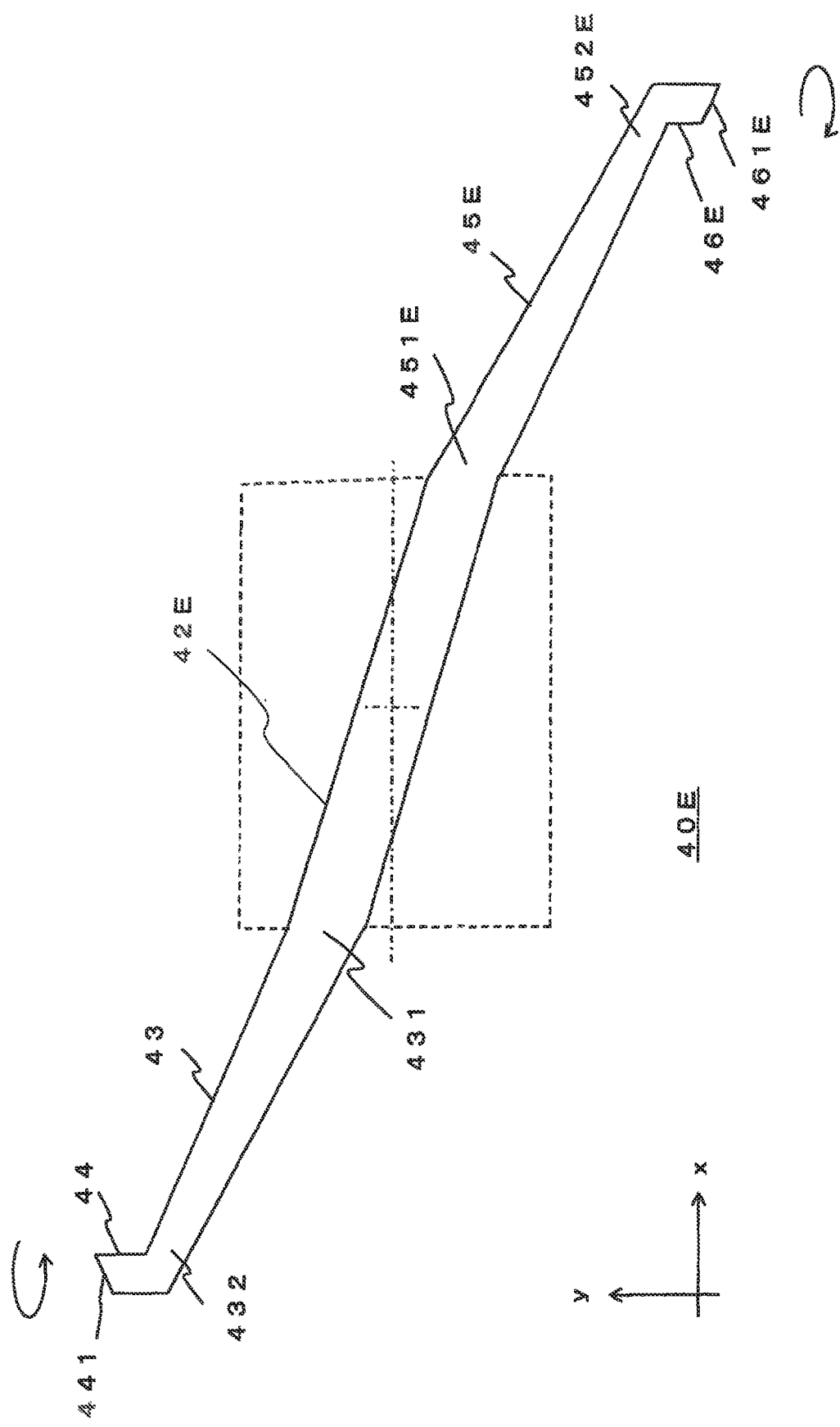
FIG. 12 is a configuration diagram showing a configuration of a plate-shaped member before formation of an electrical contactor of a third embodiment.
Figure 13:
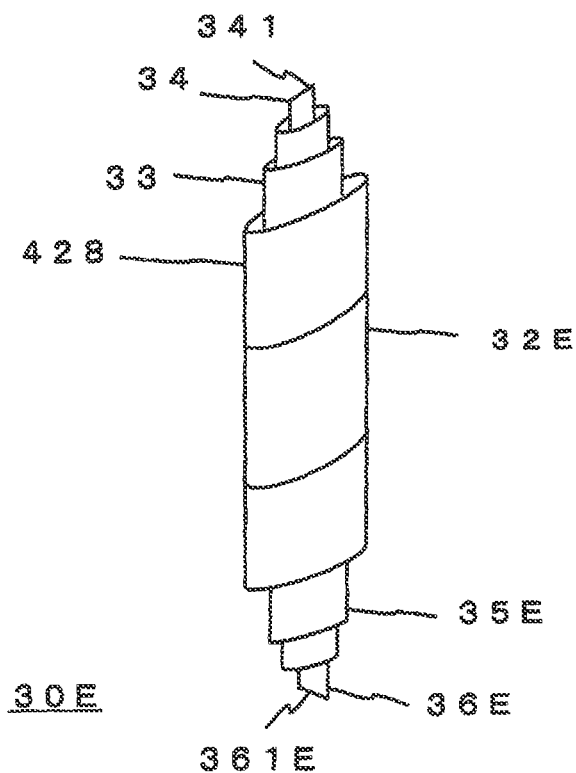
FIG. 13 is a configuration diagram showing a configuration of the electric contractor according to the third embodiment.

FIG. 12 is a configuration diagram showing a configuration of a plate-shaped member before formation of the electrical contactor of the third embodiment. FIG. 13 is a configuration diagram showing a configuration of the electrical contractor according to the third embodiment.

As shown in FIG. 12, a plate-shaped member 40E of the third embodiment includes a main body 42E, an upper arm portion 43 extending diagonally upward and leftward from a left end portion of the main body 42E, a first tip end portion 44 provided at the tip end of the upper arm portion 43, a lower arm portion 45E extending diagonally downward and rightward from the right end portion of the main body 42E, and a second tip end portion 46E provided at the tip end of the lower arm portion 45E.

Also, in the third embodiment, the tip end surface of the first tip end portion 44 has a first inclined portion 441 having an inclined surface, while the tip end surface of the second tip end portion 46E has a second inclined portion 461E having an inclined surface.

The first and second embodiments illustrate the case where the plate-shaped members 40 and 40D have the main bodies 42 and 42D having a substantially rectangular shape, and the cylindrical portion 32 is formed when the plate-shaped members 40 and 40D are wound to form the connectors 30 and 30D. The cylindrical portion 32 functions as a stopper that regulates the strokes in the vertical direction of the upper elastic portion 33 and the lower elastic portions 35 and 35D when housing the connectors 30 and 30D, respectively.

In contrast, in the third embodiment, the connector can be manufactured more easily by winding the plate-shaped member. That is, by forming the main body 43E, which had been shaped as a substantially rectangle, into a strip shape, the shape of the entire plate-shaped member 40E is also formed in the strip shape. By forming the main body 42E into the strip shape, the entire plate-shaped member 40E and an electrical contactor 30E formed therefrom can be reduced in size.

As shown in FIG. 12, the plate-shaped member 40E of the third embodiment can also be considered to be an elongated plate-shaped member extending in a diagonal direction. For example, FIG. 12 illustrates a case where the length of the vertical width of the main body 42E is the same as the length of the vertical width of the proximal end portion 431 of the upper arm portion 43 (or the proximal end portion 451E of the lower arm portion 45E) and the main body 42E is a parallelogram, but the shape of the main body 42E is not limited to that shown in FIG. 12.

The winding direction of the upper arm portion 43 and the winding direction of the lower arm portion 45E are different from each other. For example, in the planar view of FIG. 12, the upper arm portion 43 may be wound counterclockwise, while the lower arm portion 45E may be wound clockwise and the like. When the upper arm portion 43 and the lower arm portion 45E are wound to form the upper elastic portion 33 and the lower elastic portion 35E, the arm portions may be wound in a concentrated winding manner to form the elastic portions. That is, the method may involve winding the upper arm portions 43 together (or the lower arm portions 45E together) at the same diameter.

Then, for example, the upper arm portion 43 is wound such that the outer side of the proximal end portion 431 of the upper arm portion 43 is covered with the main body 42E to thereby form the upper elastic portion 33 inside the main body 42E as shown in FIG. 13. Likewise, the lower arm portion 45E is wound such that the outer side of the proximal end portion 451E of the lower arm portion 45 is covered with the main body 42E to thereby form the lower elastic portion 35E inside the main body 42E as shown in FIG. 13.

Here, the wound main body 42E is referred to as a coupling portion 32E that couples the upper elastic portion 33 and the lower elastic portion 35E. The coupling portion 32E of the electrical contactor 30E is located so as to cover both the outer sides of the upper elastic portion 33 and the lower elastic portion 35E, each having the bamboo-shoot-like spring structure. Therefore, when the upper elastic portion 33 and the lower elastic portion 35E are subjected to a compressive load, the upper elastic portion 33 and the lower elastic portion 35E independently have the vertical elasticity in the axial direction.

By making the winding directions of the upper arm portion 43 and the lower arm portion 45E different from each other as in the second embodiment, the stress acting on the upper elastic portion 33 and the stress acting on the lower elastic portion 35E can be canceled out when the first contact portion 34 contacts the first contact target while the second contact portion 36E contacts the second contact target to thereby apply a load to the first and second contact portions. Therefore, this can reduce the rotational load generated on the contact point when the first contact portion 34 contacts the first contact target and the contact point when the second contact portion 36E contacts the second contact target.

As in the first and second embodiments, when the first inclined contact portion 341 of the upper elastic portion 33 contacts the first contact target and the second inclined contact portion 361E of the second contact portion 36E contacts the second contact target, the entire electrical contactor 30E is deformed, so that the constituent parts of the upper elastic portion 33 and the lower elastic portion 35E are electrically contactable on one side. Therefore, the substantially linear conduction path is formed between the first contact target and the second contact target, improving the electrical conductivity.

(C-2) Effects of Third Embodiment

As described above, according to the third embodiment, the effects described in the first and second embodiments are obtained, and the connector can be manufactured more easily by winding the plate-shaped member.

(D) Other Embodiments

Although various modified embodiments have also been described in the above-mentioned first to third embodiments, the present disclosure can also be applied to the following modified embodiments.

(D-1) The first to third embodiments have illustrated the case where the connector 30 is applied as one of the electrical contactors, but the electrical contactor of the present disclosure is not limited thereto and can be applied to a probe that electrically contacts a wiring terminal (for example, the first contact target) of a wiring pattern and an electrode terminal (for example, the second contact target) of an object to be inspected, such as a semiconductor integrated circuit, for example.

Furthermore, the first to third embodiments have illustrated the case where the tip ends of both the first contact portion and the second contact portion of the electrical contactor are inclined surfaces (the first inclined contact portion and the second inclined contact portion), but either the first contact portion or the second contact portion may be an inclined surface (the inclined contact portion).

For example, when the electrical contactor of the present disclosure is applied to a probe that electrically contacts a wiring terminal on a flat contact surface and, for example, an electrode terminal of a hemispherical body (a hemispherical surface), the tip end of the second contact portion that contacts the electrode terminal on the hemispherical surface may be, for example, needle-shaped. Further, the surface of the electrode terminal on the hemispherical surface may be pierced with the needle-shaped second contact portion. Meanwhile, the tip end of the first contact portion that contacts the wiring terminal on the flat contact surface may be an inclined surface (the first inclined contact portion). In this case, the second contact portion which pierces the surface of the electrode terminal serves as the axis, and the first inclined contact portion contacts the wiring terminal while being tilted, so that the entire probe or part of the constituent element thereof is bent (deformed), thus shortening the electrical conduction path to improve the electrical conductivity. Obviously, as described in the first embodiment, the electrical conductivity can be improved even when the tip ends of both the first contact portion and the second contact portion of the probe are inclined surfaces (the first inclined contact portion and the second inclined contact portion).

(D-2) The first to third embodiments have illustrated, for example, the case where the surface of the connection terminal 14a of the first contact target and the tip end surface of the first contact portion 34 (the first inclined contact portion 341) are tilted relative to each other, that is, the case where the normal direction of the surface of the connection terminal 14a of the first contact target and the normal direction of the tip end surface of the first contact portion 34 (the first inclined contact portion 341) are different relative to each other.

As a modification as illustrated in FIGS. 9(A) and 9(B), the present disclosure can also be applied to the case where the connection terminal 14a as the first contact target is tilted (which means not maintaining its horizontality), and the surface of the connection terminal 14a of the first contact target and the tip end surface of the first contact portion 34 (the first inclined contact portion 341) are tilted relative to each other. That is, the example shown in FIG. 9(A) corresponds to the case where the normal line of the surface of the connection terminal 14a does not coincide with the central axis A of the connector 30. Also in this case, the first contact portion 34 is in surface contact with the connection terminal 14a, which deforms the connector 30 to shorten the electrical conduction path as in the first embodiment. Consequently, this example has the same effects as the first embodiment.

(D-3) The plate-shaped member before the formation of the electrical contactor is not limited to the shapes described in the first to third embodiments. For example, the plate-shaped member may be shaped as follows.

For example, the shape of the upper arm portion 43 of the plate-shaped member 40 shown in FIG. 2 may be, for example, an arc shape such as an arch, or a bent shape. In this way, the upper arm portion 43 has a shape warped into an arc or a bent shape, and the length of the vertical width of the upper arm portion 43 is elongated, so that the upper elastic portion 33 formed by winding the upper arm portion 43 can have its vertical urging force reduced (under a lower load). That is, the contact load applied when the first contact portion 34 is in contact with the first contact portion 34 can be reduced.

For example, the length of the vertical width of the tapered lower arm portion 45 may be made thicker than the upper arm portion 43. By thickening the lower arm portion 45 in this way, the lower elastic portion 35 formed by winding the lower arm portion 45 can increase its vertical urging force (under a higher load). That is, the contact load when the second contact portion 36 is in contact with the second contact target can be increased.

Further, for example, the first embodiment illustrates the case where the upper arm portion 43 and the lower arm portion 45 are extended from the same end portion from among the end portions on the four sides of the main body 42, but these arm portions are not limited to this shape. For example, the upper arm portion 43 may be shaped to extend diagonally upward and leftward from an upper part of the left end portion of the main body 42, and the lower arm portion 45 may be shaped to extend from a lower part of the right end portion of the main body 42 diagonally downward and rightward.

Furthermore, for example, one or more slits having a substantially trapezoidal shape may be formed by performing a hollowing process from the proximal end portion 431 of the upper arm portion 43 extending from the main body 42 to its tip end side. Similarly, one or more slits having a substantially trapezoidal shape may be formed by performing a hollowing process from the proximal end portion 451 of the lower arm portion 45 to its tip end side. The number, shape, etc., of the slits provided in the upper and/or lower arm portion are not limited. Thus, providing one or more slits in the upper and/or lower arm portions can adjust the magnitude of the load on the first contact portion and the second contact portion of the connector formed by winding the plate-shaped member, as well as the vertical strokes of the upper elastic portion and the lower elastic portion.

(D-4) To maintain the external structure of the cylindrical portion as illustrated in the above-mentioned embodiments, any point of the cylindrical portion may be fixed by a predetermined method (for example, welding, an adhesive, or the like).

Figure 14:
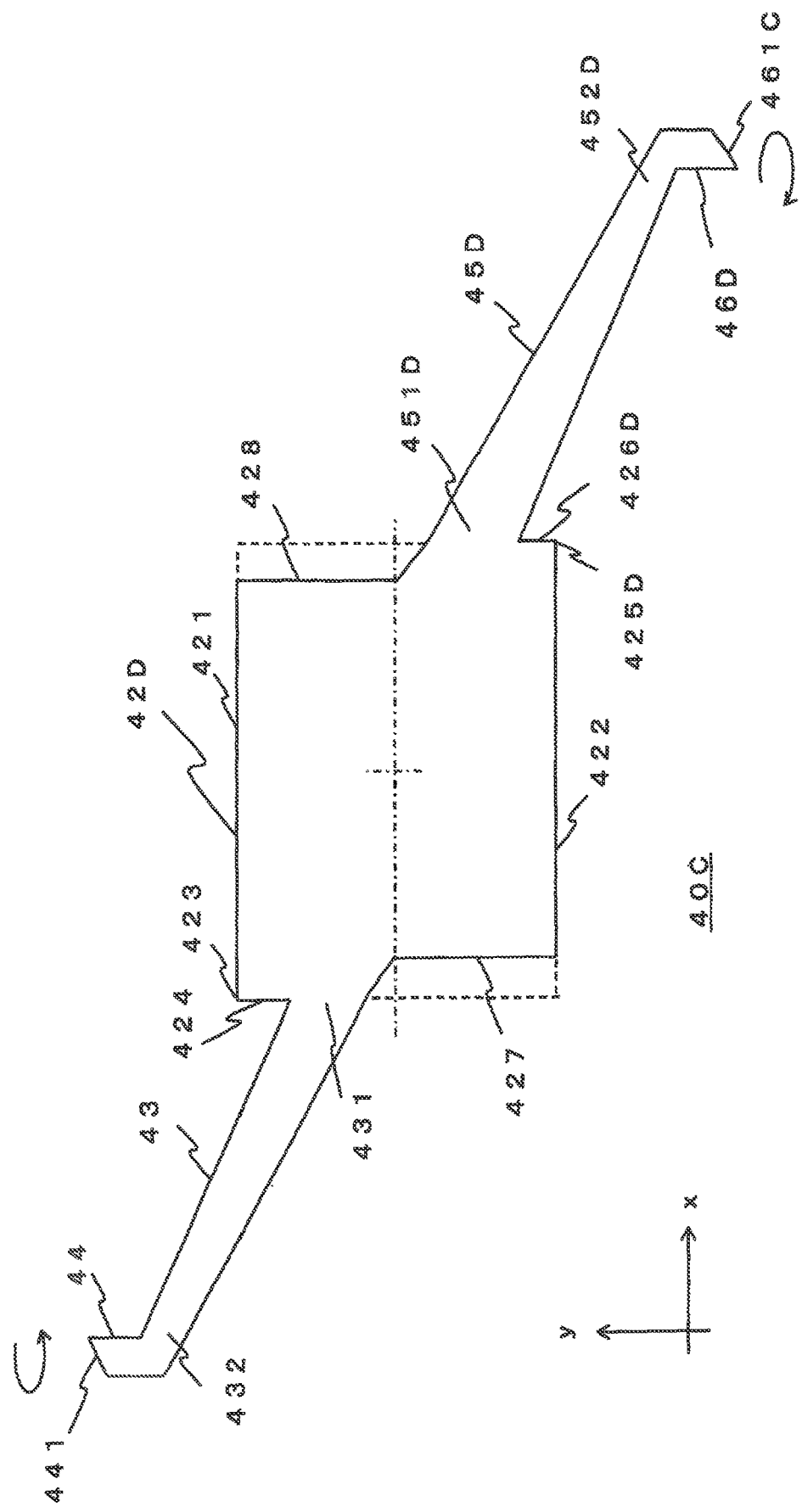
FIG. 14 is a configuration diagram showing a configuration of a plate-shaped member according to a modified embodiment.

(D-5) FIG. 14 is a configuration diagram showing a configuration of a plate-shaped member according to a modified embodiment. A plate-shaped member 40C shown in FIG. 14 is a modified example of the plate-shaped member for forming the electrical contactor 30D of the second embodiment shown in FIG. 11(B). A difference between the plate-shaped member 40C shown in FIG. 14 and the plate-shaped member 40E shown in FIG. 12 is an inclination of the tip end surface of the second tip end portion 46D of the lower arm portion 45D.

In order for the electrical conduction path in the electrical contactor 30D to function effectively, it is desirable that the inclined surfaces of the first inclined contact portion 341 of the first contact portion 34 and the second inclined contact portion 361D of the second contact portion 36D be linearly symmetrical in the finally built-up state of the electrical contactor 30D shown in FIG. 11(B) (for example, the first inclined contact portion 341 be oriented diagonally upward and rightward, and the second inclined contact portion 361D be oriented diagonally downward and rightward).

However, when actually building up the electrical contactor 30D, the upper arm portion 43 and the lower arm portion 45D are formed by winding, and because of this, the number of windings of the upper arm portion 43 and the lower arm portion 45D are not always identical. Thus, the plate-shaped member 40E is not limited to the shape shown in FIG. 12, and the inclination of the first inclined portion 441 of the first tip end portion 44 in the upper arm portion 43 and the inclination of a second inclined portion 461C of the second tip end portion 46D in the lower arm portion 45D may be parallel or substantially parallel with each other, as illustrated in the example of FIG. 14. It is noted that the plate-shaped member is not limited to the shape shown in FIG. 14 as long as the inclinations of the first inclined portion 441 and the second inclined portion 461C are parallel or substantially parallel.

Figure 15:
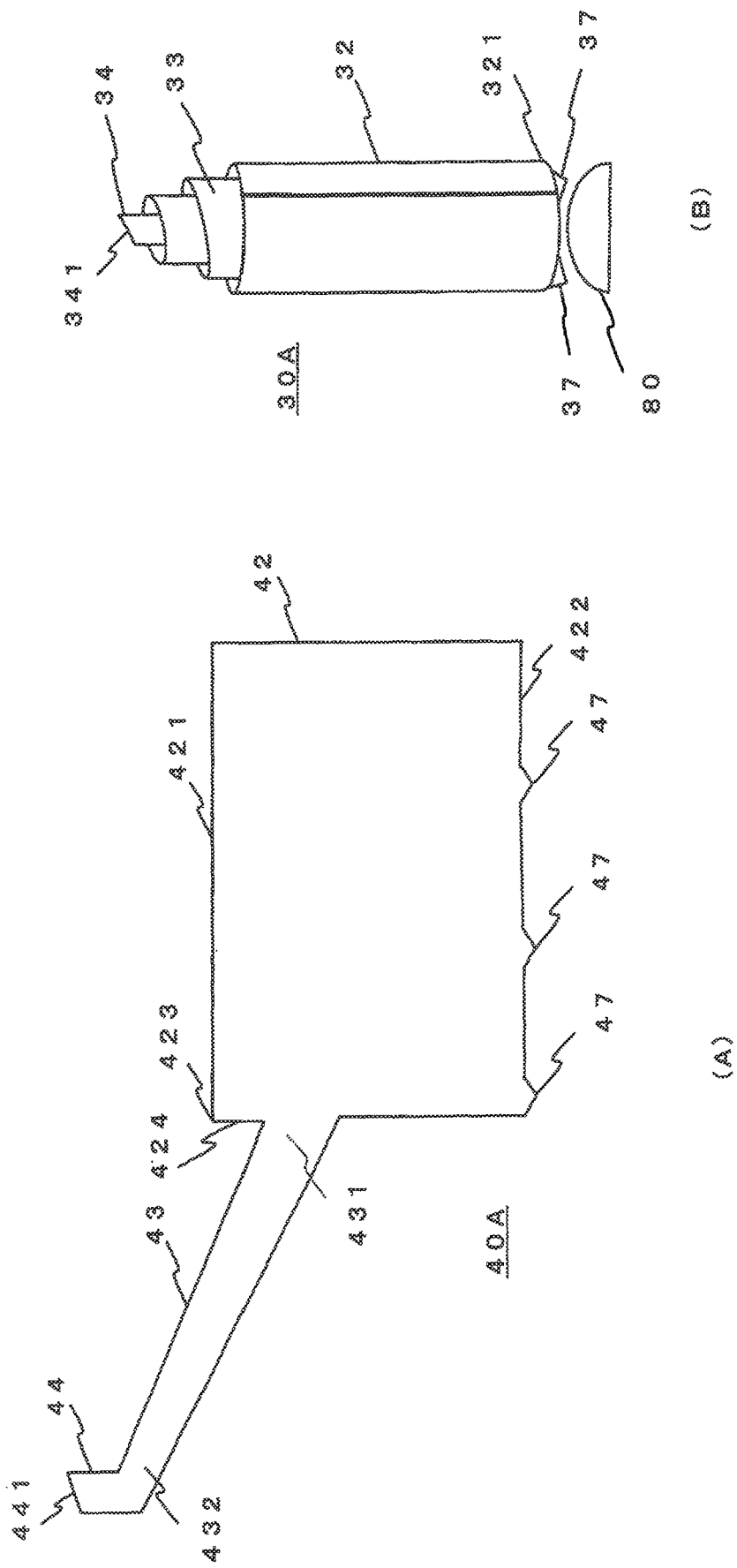
FIG. 15 is a configuration diagram showing the configuration of a plate-shaped member and an electrical contactor according to the modified embodiment.

(D-6) FIG. 15 is a configuration diagram showing the configuration of a plate-shaped member and an electrical contactor according to a modified embodiment.

For example, the electrical contactor of the present disclosure may be applied to a probe or the like mounted on a socket, such as a test socket, which is used for electrical inspection of a packaged integrated circuit. In that case, the contact target of the electrical contactor may be hemispherical, like a solder ball or the like, for example. Therefore, in this modified embodiment, an electrical contactor that can also be used when a solder ball or the like is the contact target will be described with reference to FIG. 15.

As shown in FIG. 15(B), an electrical contactor 30A of the second embodiment includes a cylindrical portion 32, a first contact portion 34, an upper elastic portion 33, and a plurality of second contact portions 37. The first contact portion 34 contacts the connection terminal 14a of the wiring board 14 as the first contact target. The upper elastic portion 33 elastically urges the first contact portion 34 in the vertical direction when the first contact portion 34 receives a load upon contact with the connection terminal 14a. The plurality of second contact portions 37 are provided on the lower end 321 of the cylindrical portion 32.

As shown in FIG. 15(A), the plate-shaped member 40A has a main body 42, an upper arm portion 43, a first tip end portion 44 provided at a tip end of the upper arm portion 43, a first inclined portion 441 which is an inclined surface provided at a tip end of the first tip end portion 44, and a plurality of chevron-shaped protrusions 47 which are convex portions each with a chevron shape at the lower end portion 422 of the main body 42. As in the first embodiment, the plate-shaped member 40A is, for example, a plate-shaped member formed of noble metal or other metals, or a plate-shaped member obtained by plating the surface of the plate-shaped member with noble metal or other metals. The plate-shaped member 40A is produced by punching out a plate-shaped member or the like. For example, the plate-shaped member 40A may be formed of noble metal or the like at portions thereof that contact the first contact target and/or the second contact target, while the other portions of the plate-shaped member 40A may be composed of an excellently elastic (for example, springy) member made of a bimetal or the like, for example.

The electrical contactor 30A shown in FIG. 15(B) is formed by performing a forming process (such as a roll-up process) on the plate-shaped member 40A shown in FIG. 15(A) and winding and rolling up the plate-shaped member 40A. When the electrical contactor 30A is formed by winding the plate-shaped member 40A, the lower end 321 of the cylindrical portion 32 and the second contact portion 37 function as a crown-shaped contact portion.

It is noted that a manufacturing method of forming the electrical contactor 30A shown in FIG. 15(B) by performing the roll-up process on the plate-shaped member 40A shown in FIG. 15(A) is basically the same as that in the first embodiment, and thus a detailed description of the manufacturing method will be omitted here.

The example shown in FIG. 15(A) and FIG. 15(B) illustrates a case where three chevron-shaped protrusions 47 are provided, but the number of protrusions 47 is not particularly limited and may be two or four or more. An installation interval between the chevron-shaped protrusions 47 can be determined depending on the size (outer shape) of the solder ball to be contacted, and the like.

A plurality of second contact portions 37 are provided at the lower end 321 of the cylindrical portion 32 as convex portions (protrusions) having the chevron shape. Such a shape enables the plurality of second contact portions (the chevron-shaped protrusions 47) 37 and the lower end 321 of the cylindrical portion 32 to electrically contact a solder ball 80. Further, by providing the second contact portions (the chevron-shaped protrusions 47) 37 at the lower end 321 of the cylindrical portion 32, the second contact portions (the chevron-shaped protrusions 47) 37 can abut against (pierce) the surface of the solder ball 80 to ensure electrical contact. The above-mentioned example illustrates the case where the second contact portions 37 as the chevron-shaped protrusions 47 are present at the lower end 321 of the cylindrical portion 32, but the second contact portion 37 as the chevron-shaped protrusion 47 may be provided at the upper end portion of the cylindrical portion 32, depending on the contact form with the contact target.

In this case, for example, the plurality of second contact portions 37 of the cylindrical portion 32 come into electric contact with the solder ball as the contact target and thereby serve as the axis, so that the first inclined contact portion 341 comes into electric contact with the wiring terminal while being tilted, so that the entire probe or part of the constituent element thereof is bent (deformed), thus shortening the electrical conduction path to improve the electrical conductivity.

As described above, the modified embodiment can ensure the electrical contact with the contact target even when the contact target is hemispherical, like the solder ball, in addition to exhibiting the effects described in the above-mentioned embodiments.

REFERENCE SIGNS LIST 30, 30D, and 30E . . . connector (electrical contactor), 32 . . . cylindrical portion, 33 . . . upper elastic portion, 34 . . . first contact portion, 341 . . . first inclined contact portion, 35, 35D, and 35E . . . lower elastic portion, 36, 36D, and 36E . . . second contact portion, 361, 361D, and 361E . . . second inclined contact portion, 37 . . . second contact portion, 40, 40A, 40D, 40C, and 40E . . . plate-shaped member, 42, 42D, and 42E . . . main body, 43 . . . upper arm portion, 44 . . . first tip end portion, 441 . . . first inclined portion, 45, 45D, and 45E . . . lower arm portion, 46, 46D, and 46E . . . second tip end portion, 461, 461C, and 461D . . . second inclined portion, 47 . . . chevron-shaped protrusion, 421 . . . upper end portion, 422 . . . lower end portion, 423 . . . upper corner, 424 . . . step, 425 and 425D . . . lower corner, 426 and 426D . . . step, 431 . . . proximal end portion, 432 . . . tip end portion, 451 . . . proximal end portion, 452 and 452D . . . tip end portion

The invention claimed is:

1. An electrical contactor formed from a plate-shaped member having electrical conductivity,
the plate-shaped member comprising: a main body; a tapered upper arm portion extending diagonally upward from one end portion of the main body; a first tip end portion provided at a tip end of the upper arm portion; a tapered lower arm portion extending diagonally downward from one end portion of the main body; and a second tip end portion provided at a tip end of the lower arm portion, the electrical contactor comprising:
a first contact portion formed by winding the first tip end portion and configured to contact a first contact target;
a first elastic portion formed by winding the upper arm portion, the first elastic portion having a bamboo-shoot-like spring structure that elastically moves the first contact portion in an axial direction;
a second contact portion formed by winding the second tip end portion and configured to contact a second contact target;
a second elastic portion formed by winding the lower arm portion, the second elastic portion having a bamboo-shoot-like spring structure that elastically moves the second contact portion in the axial direction; and
a coupling portion that couples the first elastic portion and the second elastic portion to enable elasticity of each of the first elastic portion and the second elastic portion by winding the main body,
wherein each or either of a tip end surface of the first contact portion that contacts the first contact target and a tip end surface of the second contact portion that contacts the second contact target is an inclined surface, and
wherein when the first contact portion and the second contact portion come into contact with the first contact target and the second contact target, the electrical contactor is deformed to make an outer wall of an inner part of each of the first elastic portion and the second elastic portion come into electrical contact with an inner wall of an outer part of each of the first elastic portion and the second elastic portion, respectively.

2. The electrical contactor according to claim 1, wherein the upper arm portion extends from the one end portion of the main body, while the first elastic portion is formed by being wound in a first direction, and
wherein the lower arm portion extends from the end portion opposed to the one end portion of the main body from which the upper arm portion extends, while the second elastic portion is formed by being wound in a second direction different from the first direction.

3. The electrical contactor according to claim 2, wherein a length of a vertical width of the main body of the plate-shaped member is substantially the same as a length of a vertical width of a proximal end portion of each of the upper arm portion and the lower arm portion.

4. The electrical contactor according to claim 2, wherein the main body of the plate-shaped member has a rectangular shape,
wherein each of the arm portions extending from the end portion of the main body having the rectangular shape extends from a position spaced apart from a corner of the end portion, and
wherein the proximal end portion of each of the elastic portions formed by winding the corresponding arm portion is covered with an inner surface of the main body wound and formed in a cylindrical shape, and is enclosed in the cylindrical main body.

5. An electrical contactor formed from a plate-shaped member having electrical conductivity,
the plate-shaped member comprising: a main body; a tapered upper arm portion extending diagonally upward from one end portion of the main body; a tip end portion provided at a tip end of the upper arm portion; and a plurality of chevron-shaped protrusions provided at a lower end portion of the main body, the electrical contactor comprising:
a first contact portion formed by winding the tip end portion and configured to contact a first contact target;
an elastic portion formed by winding the upper arm portion, the elastic portion having a bamboo-shoot-like spring structure that elastically moves the first contact portion in an axial direction; and
a cylindrical portion that accommodates a proximal end portion of the elastic portion therein by winding the main body, the cylindrical portion being configured to contact a second contact target, together with the plurality of chevron-shaped protrusions on the lower end portion, wherein a tip end surface of the first contact portion that contacts the first contact target is an inclined surface, and wherein when the first contact portion comes into contact with the first contact target, the electrical contactor is deformed to make an outer wall of an inner part of the elastic portion come into electrical contact with an inner wall of an outer part of the elastic portion.

6. An electrical connecting structure comprising a first contact target, a second contact target, and an electrical contactor that electrically contacts the first contact target and the second contact target, the electrical connecting structure electrically connecting the first contact target and the second contact target via the electrical contactor, wherein the electrical contactor comprises: a first contact portion that contacts the first contact target; a first elastic portion having a bamboo-shoot-like spring structure that elastically moves the first contact portion in an axial direction; a second contact portion that contacts the second contact target; a second elastic portion having a bamboo-shoot-like spring structure that elastically moves the second contact portion in the axial direction; and a coupling portion that couples the first elastic portion and the second elastic portion, the coupling portion enabling elasticity of each of the first elastic portion and the second elastic portion, wherein a tip end surface of the first contact portion and/or the second contact portion and a surface of the first contact target and/or the second contact target are opposed while being tilted relative to each other, and wherein, when the tip end surface of the first contact portion and the surface of the first contact target contact each other, while the tip end surface of the second contact portion and the surface of the second contact target contact each other, the electrical contactor is deformed to make an outer wall of an inner part of each of the first elastic portion and the second elastic portion electrically contactable with an inner wall of an outer part of each of the first elastic portion and the second elastic portion, respectively.

7. The electrical connecting structure according to claim 6, wherein a direction perpendicular to the tip end surface of the first contact portion and/or the second contact portion is not opposed to a direction perpendicular to the surface of the first contact target and/or the second contact target.

8. The electrical connecting structure according to claim 7, wherein a direction perpendicular to the surface of the first contact target and/or the second contact target deviates from the axial direction of the electrical contactor.

9. The electrical connecting structure according to claim 6, wherein the first contact target is a wiring terminal, the second contact target is an electrode terminal of an object to be inspected, and the electrical contactor is a probe that electrically contacts the wiring terminal and the electrode terminal of the object to be inspected.

10. An electrical connecting apparatus comprising a plurality of electrical contactors, each being configured to contact a first contact target and a second contact target, wherein each of the plurality of electrical contactors is the electrical contactor according to claim 1.

11. The electrical contactor according to claim 1, wherein the main body of the plate-shaped member has a rectangular shape, wherein each of the arm portions extending from the end portion of the main body having the rectangular shape extends from a position spaced apart from a corner of the end portion, and wherein a proximal end portion of each of the elastic portions formed by winding the corresponding arm portion is covered with an inner surface of the main body wound and formed in a cylindrical shape, and is enclosed in the cylindrical main body.

12. The electrical connecting structure according to claim 6, wherein a direction perpendicular to the surface of the first contact target and/or the second contact target deviates from the axial direction of the electrical contactor.

13. An electrical connecting apparatus comprising a plurality of electrical contactors, each being configured to contact a first contact target and a second contact target, wherein each of the plurality of electrical contactors is the electrical contactor according to claim 5.

* * * * *